United States Patent
Park et al.

(10) Patent No.: US 9,837,272 B2
(45) Date of Patent: Dec. 5, 2017

(54) METHODS OF MANUFACTURING SEMICONDUCTOR DEVICES

(71) Applicant: SAMSUNG ELECTRONICS CO., LTD., Suwon-si, Gyeonggi-do (KR)

(72) Inventors: Su-Min Park, Seoul (KR); Su-Min Kim, Suwon-si (KR); Hyo-Jin Yun, Suwon-si (KR); Hyun-Woo Kim, Seongnam-si (KR); Kyoung-Seon Kim, Suwon-si (KR); Hai-Sub Na, Seoul (KR); Min-Ju Park, Seoul (KR); So-Ra Han, Bucheon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 4 days.

(21) Appl. No.: 15/092,263

(22) Filed: Apr. 6, 2016

(65) Prior Publication Data
US 2016/0314970 A1 Oct. 27, 2016

(30) Foreign Application Priority Data
Apr. 22, 2015 (KR) .................. 10-2015-0056843

(51) Int. Cl.
| | | |
|---|---|---|
| H01L 21/302 | (2006.01) | |
| H01L 21/461 | (2006.01) | |
| H01B 13/00 | (2006.01) | |
| B23P 15/00 | (2006.01) | |
| C03C 25/00 | (2006.01) | |
| C23F 1/00 | (2006.01) | |
| H01L 21/033 | (2006.01) | |
| H01L 21/322 | (2006.01) | |

(Continued)

(52) U.S. Cl.
CPC .... *H01L 21/0337* (2013.01); *H01L 21/31116* (2013.01); *H01L 21/31144* (2013.01); *H01L 21/3223* (2013.01); *H01L 21/425* (2013.01); *H01L 21/426* (2013.01); *H01L 27/10855* (2013.01); *H01L 27/10888* (2013.01)

(58) Field of Classification Search
None
See application file for complete search history.

(56) References Cited

U.S. PATENT DOCUMENTS

| | | |
|---|---|---|
| 7,659,208 B2 | 2/2010 | Zhou et al. |
| 8,637,389 B2 | 1/2014 | Chen et al. |

(Continued)

FOREIGN PATENT DOCUMENTS

| | | |
|---|---|---|
| JP | 2012174976 | 9/2012 |
| JP | 2013201356 | 10/2013 |

(Continued)

*Primary Examiner* — Stephanie Duclair
(74) *Attorney, Agent, or Firm* — F. Chau & Associates, LLC

(57) ABSTRACT

In a method of manufacturing a semiconductor device, a mask layer and a first layer may be sequentially formed on a substrate. The first layer may be patterned by a photolithography process to form a first pattern. A silicon oxide layer may be formed on the first pattern. A coating pattern including silicon may be formed on the silicon oxide layer. The mask layer may be etched using a second pattern as an etching mask to form a mask pattern, and the second pattern may includes the first pattern, the silicon oxide layer and the coating pattern. The mask pattern may have a uniform size.

20 Claims, 35 Drawing Sheets

(51) Int. Cl.
  *H01L 21/426*  (2006.01)
  *H01L 21/425*  (2006.01)
  *H01L 21/311*  (2006.01)
  *H01L 27/108*  (2006.01)

(56) References Cited

U.S. PATENT DOCUMENTS

| | | | |
|---|---|---|---|
| 8,658,526 B2 * | 2/2014 | Xu | H01L 21/0337 257/E21.668 |
| 2006/0240361 A1 * | 10/2006 | Lee | H01L 21/0338 430/313 |
| 2009/0017631 A1 * | 1/2009 | Bencher | H01L 21/0338 438/703 |
| 2009/0274980 A1 | 11/2009 | Kang et al. | |
| 2009/0323385 A1 | 12/2009 | Scheuerlein et al. | |
| 2011/0177691 A1 * | 7/2011 | Kang | H01L 21/0337 438/694 |
| 2011/0312184 A1 | 12/2011 | Lee et al. | |
| 2012/0114559 A1 | 5/2012 | Singh et al. | |
| 2012/0211873 A1 | 8/2012 | Oyama et al. | |
| 2012/0329282 A1 * | 12/2012 | Chang | H01L 21/76807 438/703 |

FOREIGN PATENT DOCUMENTS

| | | |
|---|---|---|
| JP | 2014505018 | 2/2014 |
| KR | 1020060110706 | 10/2006 |
| KR | 1020090115564 | 11/2009 |
| KR | 1020110028525 | 3/2011 |
| KR | 1020110084030 | 7/2011 |
| KR | 1020110137521 | 12/2011 |

\* cited by examiner

SECOND DIRECTION
THIRD DIRECTION
FIRST DIRECTION

METHODS OF MANUFACTURING SEMICONDUCTOR DEVICES

CROSS-REFERENCE TO RELATED APPLICATION

This application claims priority under 35 U.S.C. §119 to Korean Patent Application No. 10-2015-0056843, filed on Apr. 22, 2015, in the Korean Intellectual Property Office (KIPO), the contents of which are incorporated by reference herein in their entirety.

TECHNICAL FIELD

Example embodiments relate to methods of manufacturing semiconductor devices. More particularly, example embodiments relate to methods of manufacturing semiconductor devices including regularly arranged fine patterns.

DISCUSSION OF THE RELATED ART

As a semiconductor device has been highly integrated, it is required to form regularly arranged fine patterns. Therefore, various methods of forming the fine patterns have been developed.

SUMMARY

Example embodiments provide a method of manufacturing a semiconductor device including regularly arranged fine patterns with a uniform size.

According to example embodiments, there is provided a method of manufacturing a semiconductor device. In the method, a mask layer and a first layer may be sequentially formed on a substrate. The first layer may be patterned by a photolithography process to form a first pattern. A silicon oxide layer may be formed on the first pattern. A coating pattern including silicon may be formed on the silicon oxide layer. The mask layer may be etched using a second pattern as an etching mask to form a mask pattern, and the second pattern may includes the first pattern, the silicon oxide layer and the coating pattern.

In example embodiments, the second pattern may be formed to have a pillar shape, or the second pattern may be a layer having holes therethrough.

In example embodiments, when the coating pattern is formed, a material including silicon may be spin coated on the silicon oxide layer to form a coating layer. The coating layer may be baked so that a material including silicon of the coating layer thermally reflows and the coating layer may be bonded onto the silicon oxide layer to form the coating pattern.

In example embodiments, the coating pattern may be formed of a material including silicon having a glass transition temperature (Tg) of about 100° C. to about 200° C.

In example embodiments, the silicon oxide layer may include OH group at a surface thereof, and silicon of the coating layer may be reacted with the OH group at the surface of the silicon oxide layer to form the coating pattern.

According to example embodiments, there is provided a method of manufacturing a semiconductor device. In the method, a first mask layer may be formed on a substrate. A plurality of second masks may be formed on the first mask layer, and the plurality of second masks may be disposed at vertices of continuously arranged polygons. A silicon oxide layer may be conformally formed on sidewalls of the second masks and the substrate to form a first recess on the silicon oxide layer at a central portion of each of the polygons. A material including silicon may be spin coated on a sidewall of the first recess to form a coating pattern and a second recess having a round sidewall. A third mask may be formed to fill the second recess. The silicon oxide layer may be anisotropically etched to form a third mask structure including a silicon oxide pattern, the coating pattern and the third mask. The first mask layer may be etched using the third mask structure as an etching mask to form a mask pattern.

In example embodiments, when the coating pattern is formed, a material including silicon may be spin coated on the silicon oxide layer to form a coating layer. The coating layer may be baked so that a material including silicon of the coating layer thermally reflows and the coating layer on the first recess of the silicon oxide layer may be bonded onto the silicon oxide layer to form the coating pattern.

In example embodiments, the coating pattern may be formed of a material including silicon having a Tg of about 100° C. to about 200° C.

In example embodiments, the bake process may be performed at a temperature of about 150° C. to about 250° C., and the temperature may be higher than the Tg of the material including silicon.

In example embodiments, after forming the coating pattern, a non-bonded portion of the coating layer may be removed by a developing process.

In example embodiments, the silicon oxide layer may include OH group at a surface thereof, and silicon of the silicon may be reacted with the OH group at the surface of the silicon oxide layer to form the coating pattern.

In example embodiments, each of the second masks may have a circular shape having a first diameter, in a plan view.

In example embodiments, the silicon oxide layer may be formed such that a minimum width of the first recess has about 1 time to about 1.1 times of the first diameter of each of the second masks.

In example embodiments, when the second mask is formed, a second mask layer may be formed on the first mask layer. The second mask layer may be patterned by a photolithography process.

In example embodiments, when the second mask is formed, a sacrificial layer may be formed on the first mask layer. The sacrificial layer may be patterned by a photolithography process to form a preliminary sacrificial pattern including holes. A second mask may be formed to fill the holes. The preliminary sacrificial pattern may be removed.

In example embodiments, the second mask and the third mask may include substantially the same material.

In example embodiments, after forming the first mask, a filling layer may be formed on the substrate to fill a gap between the first masks. The first mask may be removed to form a filling layer having a hole.

According to example embodiments, there is provided a method of manufacturing a semiconductor device. In the method, a first mask layer may be formed on a substrate. A plurality of second masks may be formed on the first mask layer, and the plurality of second masks may be disposed at vertices of continuously arranged polygons. A silicon oxide layer may be conformally formed on sidewalls of the second masks and the substrate to form a first recess on the silicon oxide layer at a central portion of each of the polygons. A material including silicon may be spin coated on a sidewall of the first recess to form a coating pattern and a second recess having a round sidewall. A third mask may be formed to fill the second recess. The silicon oxide layer on the plurality of second masks may be etched to form a silicon oxide pattern. The plurality of second masks and the third mask may be removed. The mask layer may be etched using the silicon oxide pattern and the coating pattern as an etching mask to form a mask pattern.

In example embodiments, when the coating pattern is formed, a material including silicon may be spin coated on the silicon oxide layer to form a coating layer.

The coating layer may be baked so that a material including silicon of the coating layer thermally reflows and the coating layer on the first recess of the silicon oxide layer may be bonded onto the silicon oxide layer to form the coating pattern.

In example embodiments, the coating pattern may be formed of a material including silicon having a Tg of about 100° C. to about 200° C.

In example embodiments, upper mask patterns may be further formed on the sacrificial layer patterns, respectively.

In example embodiments, the sacrificial layer patterns and the filling layer may include a carbon-containing layer or a polysilicon layer.

According to example embodiments, there is provided a method of manufacturing a semiconductor device. In the method, In example embodiments, upper mask patterns may be further formed on the sacrificial layer patterns, respectively.

According to example embodiments, there is provided a method of manufacturing a semiconductor device. In the method, In example embodiments, an upper mask layer may be further formed on the etch target layer.

According to example embodiments, regularly arranged etching masks may be formed on the substrate to have a uniform size. Thus, a highly integrated semiconductor device may be manufactured by the etching mask.

BRIEF DESCRIPTION OF THE DRAWINGS

Example embodiments will be more clearly understood from the following detailed description taken in conjunction with the accompanying drawings. FIGS. 1A to 34 represent non-limiting, example embodiments as described herein.

FIGS. 1A, 2A, 3A, 4A, 5A, 6A, 7A, 8A and 9A are cross-sectional views illustrating stages of a method of manufacturing a semiconductor device in accordance with example embodiments;

FIGS. 23 to 34 are cross-sectional views and plan views illustrating stages of a method of manufacturing the semiconductor device in accordance with example embodiments.

DETAILED DESCRIPTION OF THE EMBODIMENTS

Figure 1A:
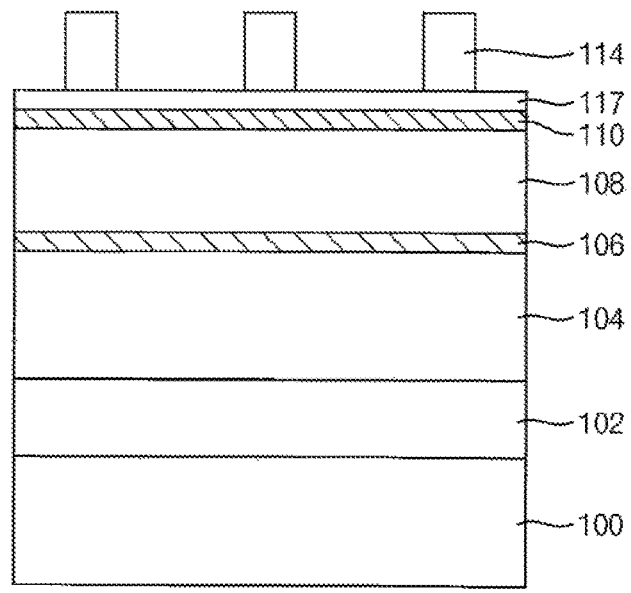

Various example embodiments will be described more fully hereinafter with reference to the accompanying drawings, in which some example embodiments are shown. The inventive concept may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout the specification. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A, 2A, 3A, 4A, 5A, 6A, 7A, 8A and 9A are cross-sectional views illustrating stages of a method of manufacturing a semiconductor device in accordance with example embodiments, and FIGS. 1B, 2B, 3B, 4B, 5B, 6B, 7B, 8B and 9B are plan views illustrating the stages of the method of manufacturing the semiconductor device. FIGS. 1C and 9C are a cross-sectional view and a plan view, respectively, illustrating the stages of the method of manufacturing the semiconductor device, and FIGS. 1D and 9D are a cross-sectional view and a plan view, respectively, illustrating the stages of the method of manufacturing the semiconductor device.

FIGS. 1A, 2A, 3A, 4A, 5A, 6A, 7A, 8A and 9A are cross-sectional views taken along lines I-I' in FIGS. 1B, 2B, 3B, 4B, 5B, 6B, 7B, 8B and 9B, respectively.

Figure 1B:
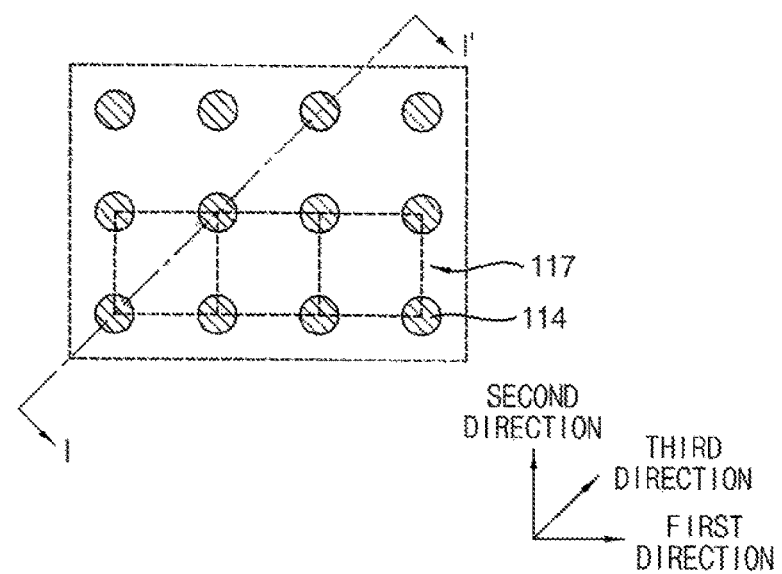
FIGS. 1B, 2B, 3B, 4B, 5B, 6B, 7B, 8B and 9B are plan views illustrating the stages of the method of manufacturing the semiconductor device.
Figure 1C:
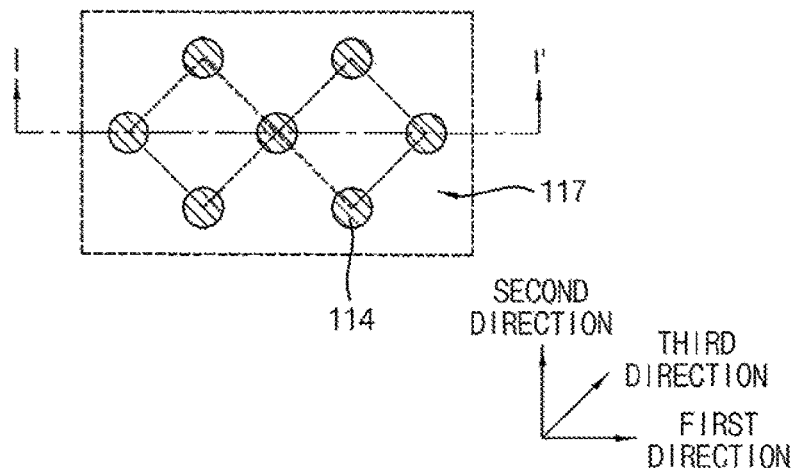
FIGS. 1C and 9C are a cross-sectional view and a plan view, respectively, illustrating the stages of the method of manufacturing the semiconductor device.
Figure 1D:
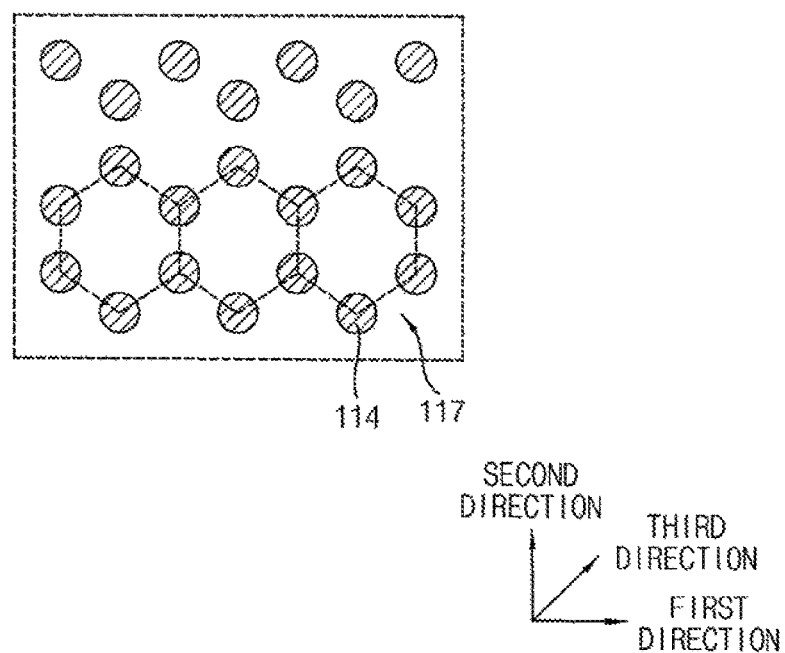
FIGS. 1D and 9D are a cross-sectional view and a plan view, respectively, illustrating the stages of the method of manufacturing the semiconductor device.

Referring to FIGS. 1A and 1B, a lower layer 102 may be formed on a substrate 100. A first mask layer 104, a first etch stop layer 106, a second mask layer 108, a second etch stop layer 110 and a bottom anti-reflective coating (BARC) layer 117 may be sequentially formed on the lower layer 102. A photoresist pattern 114 may be formed on the BARC layer 117 by a photolithography process.

The substrate 100 may be a semiconductor substrate, e.g., a silicon substrate, a germanium substrate, a silicon-germanium substrate, a silicon-on-insulator (SOI) substrate, a germanium-on-insulator (GOI) substrate, etc.

The lower layer 102 may be an etch target layer, which may be patterned to form a target pattern by a photolithography process using first masks 104a and 104b (refer to FIGS. 9A and 9B) subsequently formed as an etching mask. In example embodiments, when the etch target layer is the substrate 100, the lower layer 102 may not be formed. In example embodiments, the lower layer 102 may include, e.g., an insulating material such as silicon oxide, silicon nitride, silicide oxynitride, etc., a semiconductor material such as polysilicon, or a conductive material such as a metal, a metal nitride, a metal silicide, a metal silicon nitride, etc.

The first mask layer 104 may be formed of a material that may serve as an etching mask for etching the lower layer 102. That is, the first mask layer 104 may be formed of a material having a high etching selectivity with respect to the lower layer 102. Thus, the material of the first mask layer 104 may be chosen in consideration of the material of the lower layer 102.

In example embodiments, the first mask layer 104 may be formed of silicon nitride, silicon oxynitride, silicon oxide, amorphous carbon, etc. When the first mask layer 104 includes amorphous carbon, the first mask layer 104 may be formed by a spin coating process. When the first mask layer 104 includes silicon nitride, silicon oxynitride or silicon oxide, the first mask layer 104 may be formed by a chemical vapor deposition (CVD) process.

The first etch stop layer 106 may be formed of a material having a high etching selectivity with respect to the second mask layer 108. Thus, the first etch stop layer 106 may serve as an etch stop layer for forming the second mask layer 108. In addition, the first etch stop layer 106 may serve as an anti-reflective layer. In example embodiments, the first etch stop layer 106 may be formed of silicon nitride or silicon oxynitride.

The second mask layer 108 may be, e.g., a spin-on-hard mask (SOH) layer, such as a silicon-based SOH layer, a carbon-based SOH layer, etc.

In example embodiments, the carbon-based SOH layer may include an amorphous carbon layer (ACL) or a carbon-containing layer. Particularly, an organic compound layer including a hydrocarbon compound containing an aromatic ring, e.g., phenyl, benzene, naphthalene, etc., or a derivative thereof, may be formed by a spin coating process. Then, the organic compound layer may be baked to form the ACL.

The second etch stop layer 110 may be formed of a material having a high etching selectivity with respect to silicon oxide. The second etch stop layer 110 may serve as an anti-reflective layer. In example embodiments, the second etch stop layer 110 may be formed of silicon nitride or silicon oxynitride.

In example embodiments, a plurality of photoresist patterns 114 may be formed to be regularly arranged, and each of the photoresist patterns 114 may have a pillar shape. In example embodiments, in a plan view, each of the photoresist patterns 114 may have a circular shape.

Each of the photoresist patterns 114 may be disposed at vertices of polygons that may be continuously arranged. In example embodiments, the polygons may be squares, rhombuses, regular pentagons, regular hexagons, etc. The arrangement of the photoresist patterns 114 may be determined according to the arrangement of the first masks 104a and 104b subsequently formed.

In some example embodiments, as shown in FIG. 1B, each of the photoresist patterns 114 may be disposed at vertices of continuously arranged squares. Two sides of each of the squares may extend in a first direction. That is, the photoresist patterns 114 may be arranged in the first direction and in a second direction substantially perpendicular to the first direction.

In some example embodiments, as shown in FIG. 1C, the photoresist patterns 114 may be disposed at vertices of continuously arranged rhombuses. Two sides of each of the rhombuses may extend in a third direction having an acute angle with the first direction. That is, the photoresist patterns 114 may be arranged in the third direction.

In some example embodiments, as shown in FIG. 1D, the photoresist patterns 114 may be disposed at vertices of continuously arranged regular hexagons.

Hereinafter, only the case in which the photoresist patterns 114 may be disposed at vertices of continuously arranged squares will be illustrated.

Figure 2A:
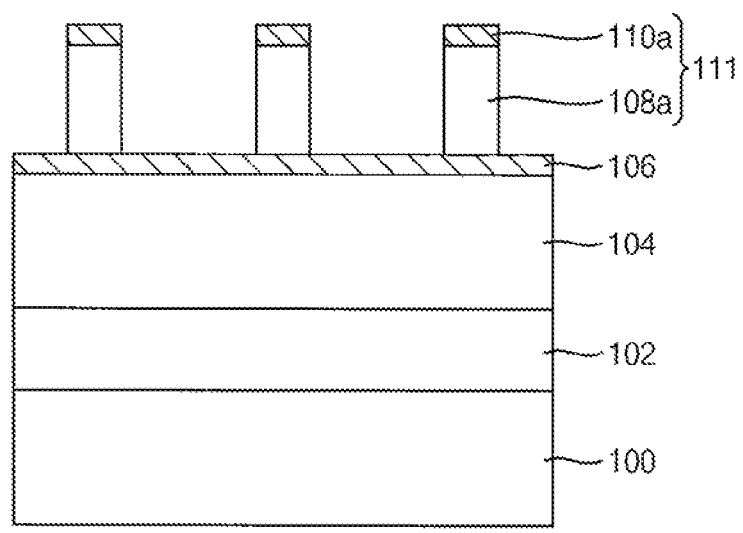
Figure 2B:
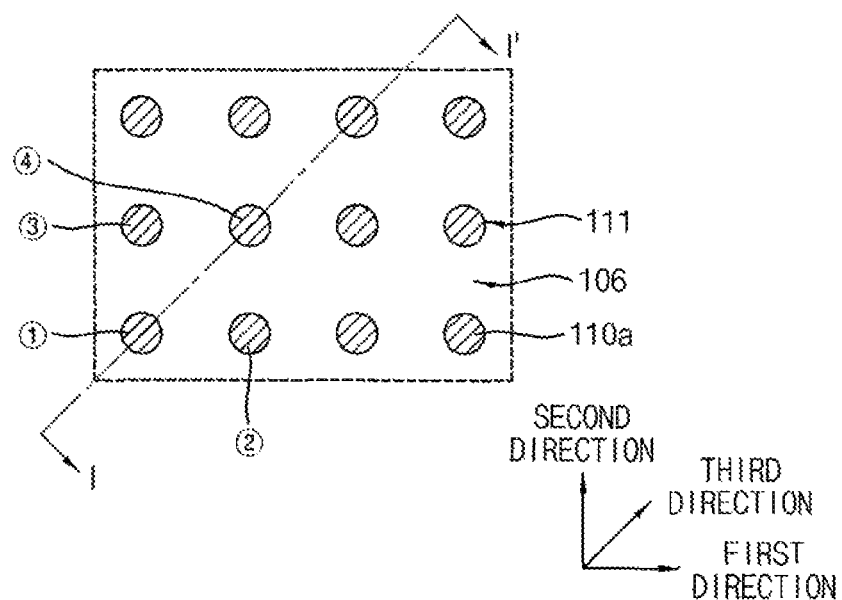

Referring to FIGS. 2A and 2B, the BARC layer 117, the second etch stop layer 110 and the second mask layer 108 may be sequentially etched using the photoresist patterns 114 as an etching mask until a top surface of the first etch stop layer 106 may be exposed, and the photoresist patterns 114 and the BARC layer 117 may be removed by an ashing process and/or a stripping process. Thus, a second mask structure 111 including a second mask 108a and a second etch stop pattern 110a sequentially stacked may be formed.

In example embodiments, a plurality of second mask structures 111 may be arranged in the same manner as the arrangement of the photoresist patterns 114. The second mask structures 111 may have shapes substantially the same as shapes of the photoresist patterns 114. Hereinafter, four second mask structures 111 disposed at vertices of a square are referred as mask 1, mask 2, mask 3 and mask 4, respectively. Mask 1 and mask 2 may be adjacent to each other in the first direction, mask 1 and mask 3 may be adjacent to each other in the second direction, and mask 1 and mask 4 may be adjacent to each other in the third direction.

Figure 3A:
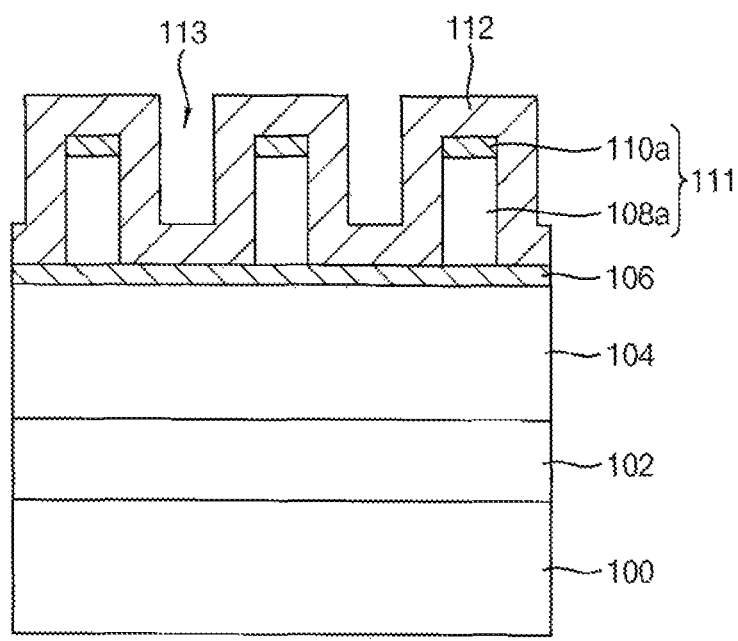
Figure 3B:
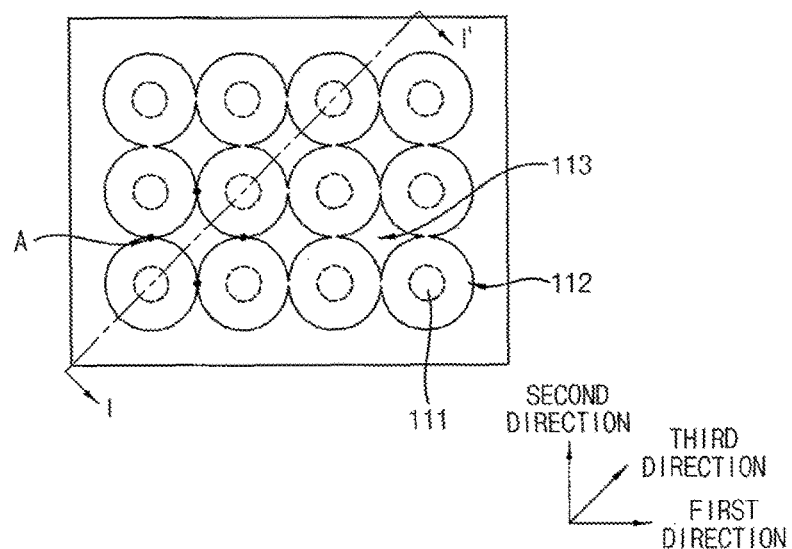

Referring to FIGS. 3A and 3B, a silicon oxide layer 112 may be conformally formed on the second mask structures 111 and the first etch stop layer 106. The silicon oxide layer 112 may be foamed by an atomic layer deposition (ALD) process or a CVD process.

Portions of the silicon oxide layer 112 on sidewalls of neighboring ones of the second mask structures 111 in the first direction may contact to each other, and portions of the silicon oxide layer 112 on sidewalls of neighboring ones of the second mask structures 111 in the second direction may contact to each other. A first recess 113 may be formed between the second mask structures 111. For example, portions of the silicon oxide layer 112 on sidewalls of mask 1 and mask 2 may contact to each other, and portions of the silicon oxide layer 112 on sidewalls of mask 1 and mask 3 may contact to each other. Portions of the silicon oxide layer 112 on sidewalls of mask 2 and mask 4 may contact to each other. Thus, the first recess 113 may be formed between mask 1 and mask 4.

In a plan view, the first recess 113 may not have a shape of a circle, but may have a shape of a polygon. Merged portions A of the silicon oxide layer 112 may correspond to vertices of the polygon.

In example embodiments, referring to FIG. 3B, the first recess 113 may have a shape of rhombus, and the merged portions A of the silicon oxide layer 112 may correspond to vertices of the rhombus.

In example embodiments, in a plan view, a minimum width of the first recess 113 may be about 1 time to about 1.1 times of a width of each of the second mask structures 111.

Figure 4A:
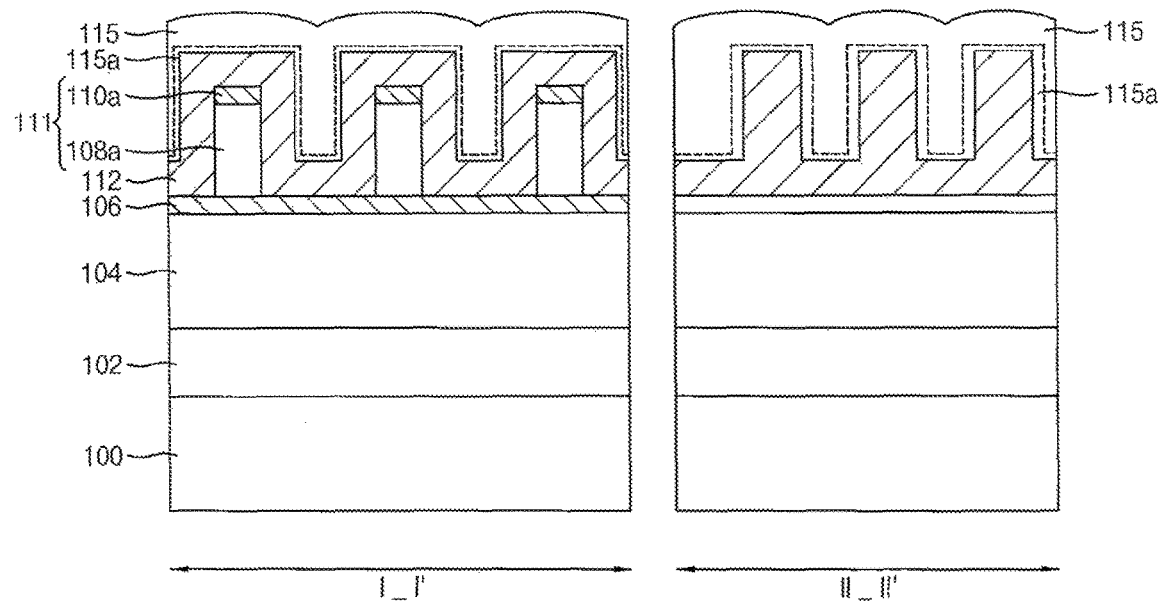
Figure 4B:
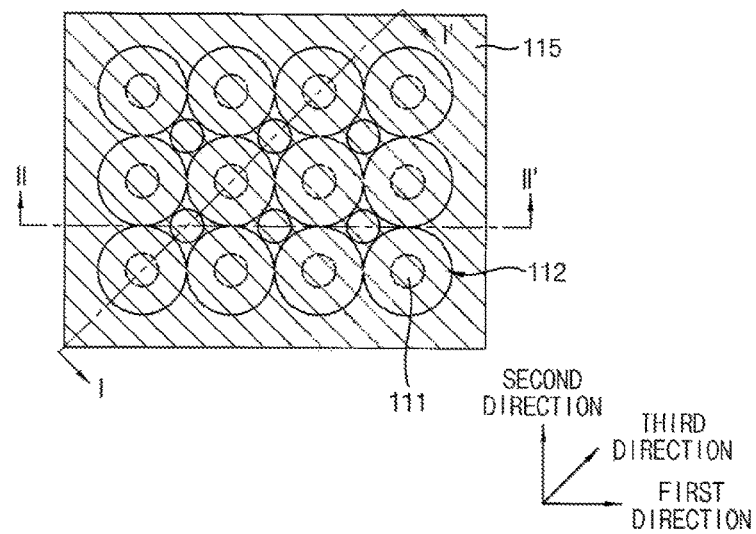

Referring to FIGS. 4A and 4B, a coating layer 115 including silicon may be formed on the silicon oxide layer 112. FIG. 4A includes cross-sectional views taken along lines I-I' and II-II' respectively, of FIG. 4B.

The coating layer 115 may be formed by a spin coating process. The coating layer 115 may be formed on the silicon oxide layer 112 to fill the first recess 113. The coating layer 115 may have a glass transition temperature (Tg) of about 100° C. to about 200° C. In example embodiments, the coating layer 115 may include a composition containing organosilane-based polymer and solvent.

A bake process may be performed on the coating layer 115. The bake process may be performed at a temperature greater than the Tg of the coating layer 115. In example embodiments, the bake process may be performed at a temperature of about 150° C. to about 250° C.

When the bake process is performed, the coating layer 115 may thermally flow to the sidewall of the first recess 113. Also, the coating layer 115 may be reacted with the silicon oxide layer 112, so that a first portion 115a of the coating layer 115 may be bonded onto the silicon oxide layer 112 to a given thickness. The first portion 115a of coating layer may be conformally formed on the silicon oxide layer 112. Particularly, OH group in the silicon oxide layer 112 and silicon in the first portion 115a of coating layer may be combined to each other, so that the first portion 115a of coating layer may be chemically bonded to the silicon oxide layer 112.

At the merged portions of the silicon oxide layer 112 in the first recess 113, a contact surface between the coating layer 115 and the silicon oxide layer 112 may increase due to a 3-dimensional effect. Thus, a portion of the coating layer 115 on the merged portions of the silicon oxide layer 112 in the first recess 113 may be formed to have a thickness greater than thicknesses of other portions of the coating layer 115 on the silicon oxide layer 112. In example embodiments, the first portion 115a of coating layer chemically bonded onto the silicon oxide layer 112 may have insulating and etching characteristics substantially the same as insulating and etching characteristics of the silicon oxide layer 112.

Figure 5A:
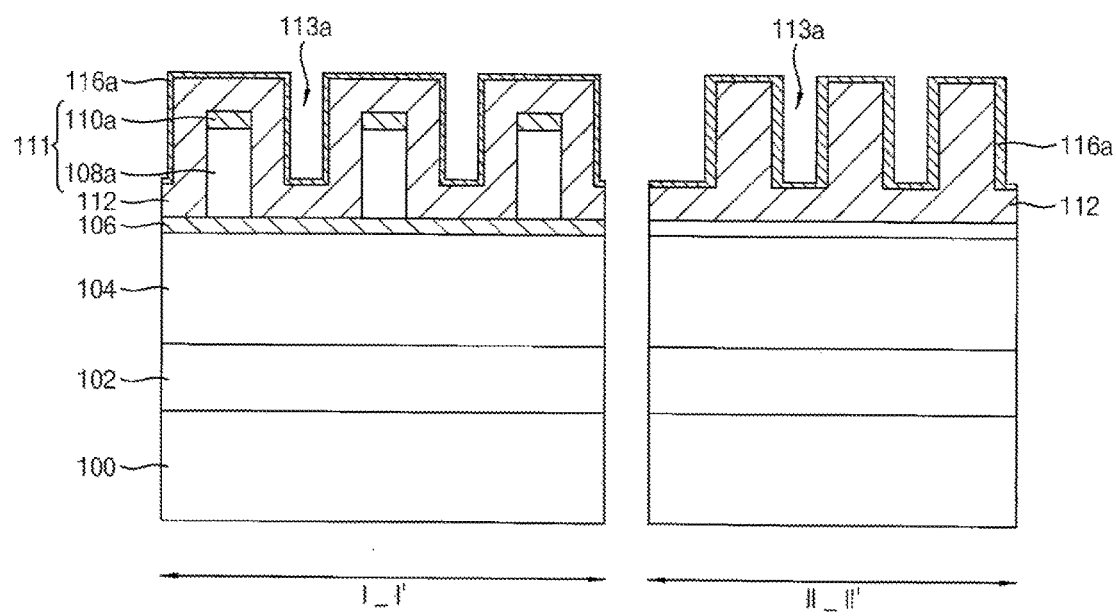
Figure 5B:
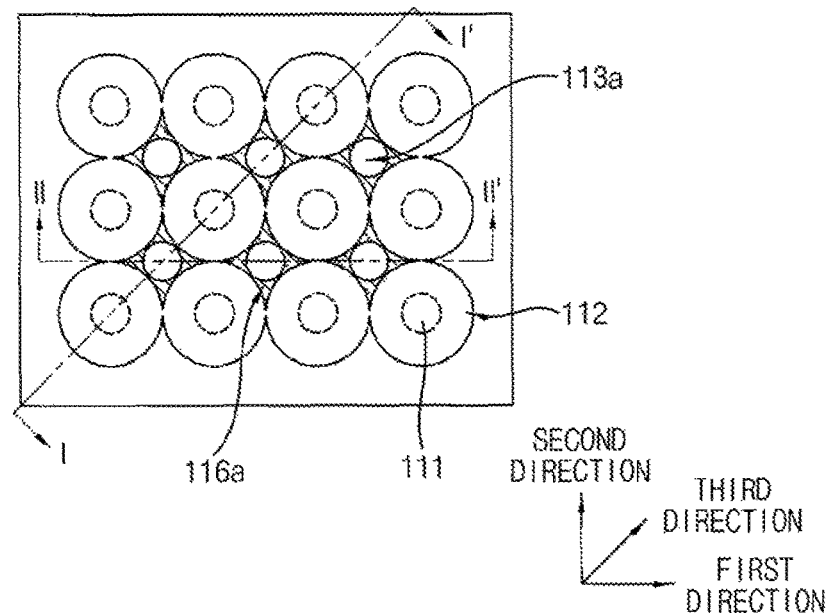

Referring to FIGS. 5A and 5B, a portion of the coating layer 115 not bonded to the silicon oxide layer 112 may be removed by a developing process to form a coating pattern 116a.

In example embodiments, the developing process may be formed using an organic developer. The organic developer may include, e.g., n-butyl acetate (nBA), 1-methoxy-2-propanol acetate (PGMEA), 1-methoxy-2- propanol (PGME), etc.

The coating pattern 116a may be formed on the silicon oxide layer 112. A portion of the coating pattern 116a on a sidewall of each of the second mask structures 111 may have a thickness greater than a thickness of a portion of the coating pattern 116a on a top surface of each of the second mask structures 111, due to the reflow of the coating layer 115. Particularly, a portion of the coating pattern 116a on the merged portion of the silicon oxide layer 112 in the first recess 113 may have the greatest thickness, due to the increased contact surface between the coating layer 115 and the silicon oxide layer 112.

As the coating pattern 116a may be formed on the silicon oxide layer 112, the first recess 113 may be transformed into a second recess 113a. In a plan view, the second recess 113a may have a circular shape. That is, the coating pattern 116a may be formed on narrow portions of the first recess 113 at which the sidewalls of the first recess 113 may contact each other, so that the narrow portions of the first recess 113 may become rounded. The second recess 113a may have a diameter substantially the same as a diameter of each of the second mask structures 111.

Figure 6A:
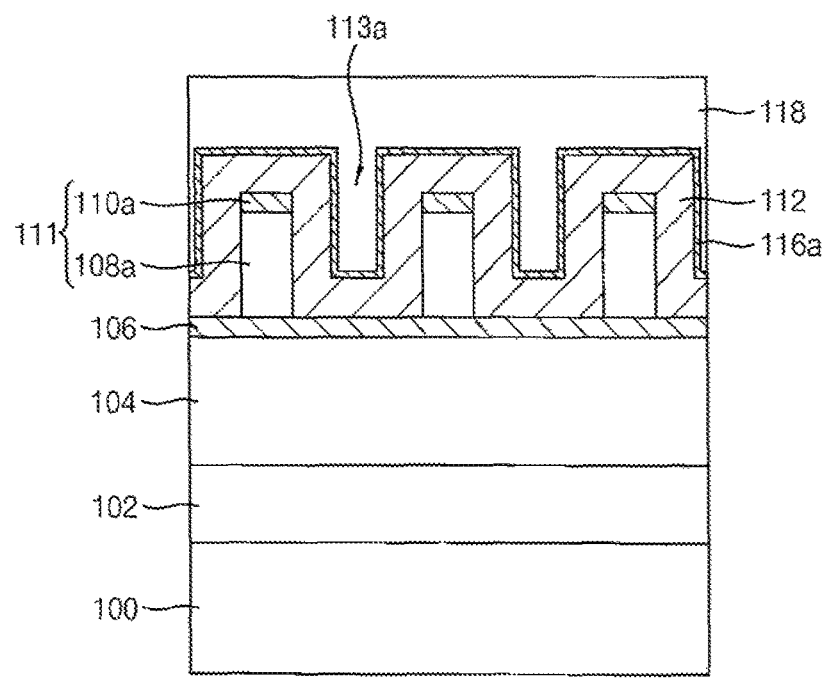
Figure 6B:
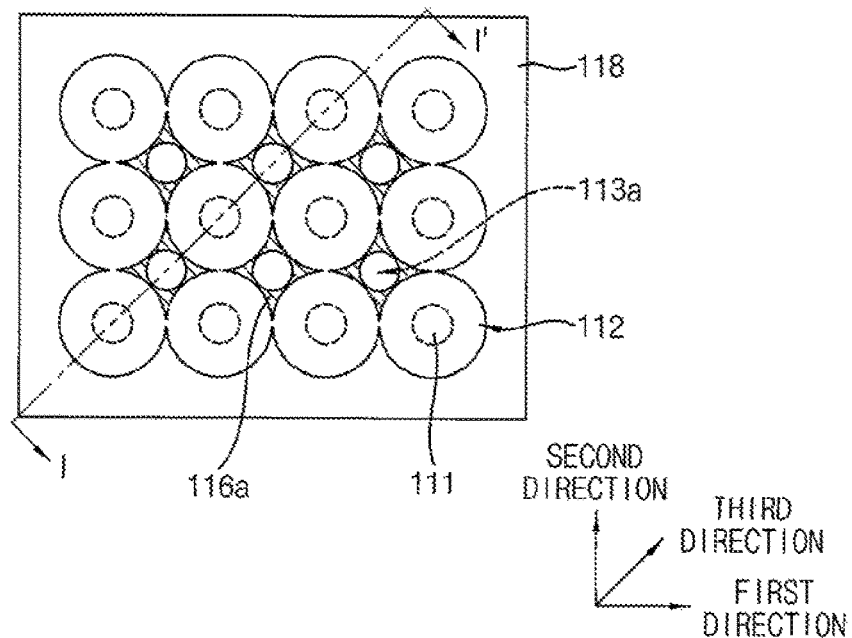

Referring to FIGS. 6A and 6B, a third mask layer 118 may be formed on the coating pattern 116a and the silicon oxide layer 112 to fill the second recess 113a. The third mask layer 118 may be formed of a material substantially the same as a material of the second mask 108a. The third mask layer 118 may include an SOH layer, e.g., a silicon-based SOH layer, a carbon-based SOH layer, etc.

Figure 7A:
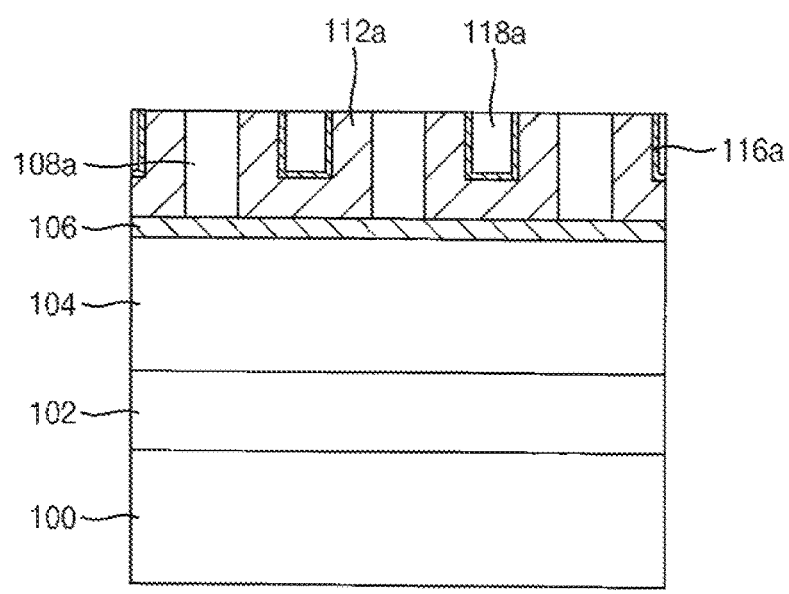
Figure 7B:
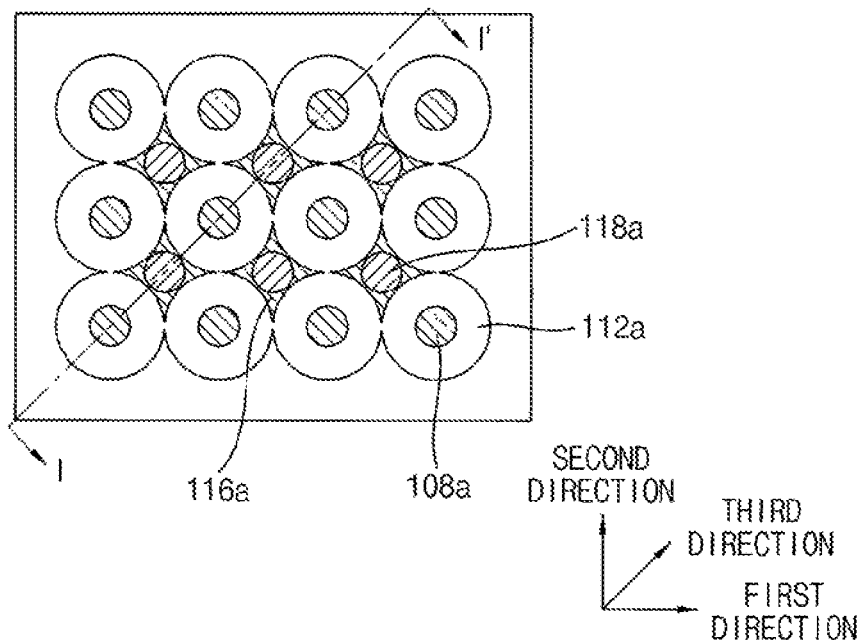

Referring to FIGS. 7A and 7B, the third mask layer 118, the silicon oxide layer 112, the coating pattern 116a and the second etch stop layer 110a may be planarized until a top surface of the second mask 108a may be exposed to form a silicon oxide pattern 112a and a third mask 118a. The planarization process may include an etch back process and/or a chemical mechanical polishing (CMP) process.

The second mask 108a may be formed by being transferred from the photoresist pattern 114 (refer to FIG. 1A), so that the second mask 108a may be arranged in the same manner as the arrangement of the photoresist pattern 114. In example embodiments, a plurality of second masks 108a may be formed at vertices of a square, respectively.

The silicon oxide pattern 112a may be conformally formed on a sidewall of the second mask 108a and a top surface of the first etch stop layer 106. A recess may be formed at an upper portion of the silicon oxide pattern 112a.

The third mask 118a may be formed to fill the recess of the silicon oxide pattern 112a. When the second masks 108a are formed at vertices of a square, respectively, the third mask 118a may be formed at a central portion of the square.

Figure 8A:
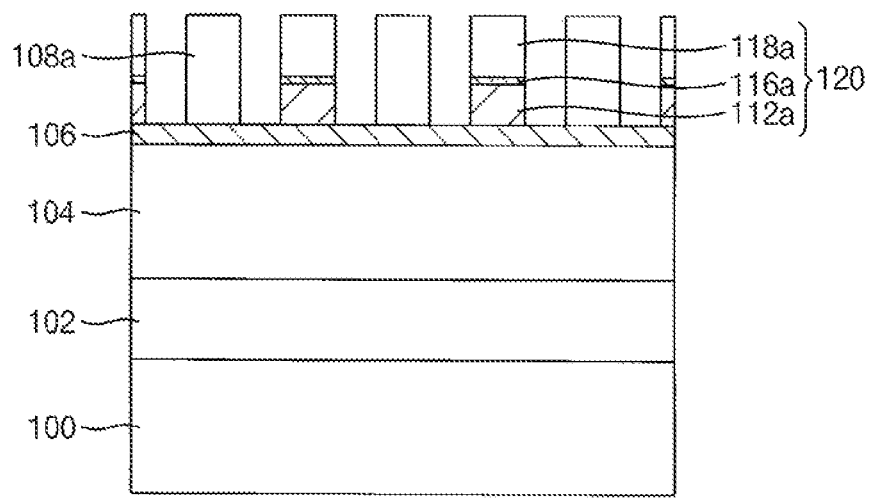
Figure 8B:
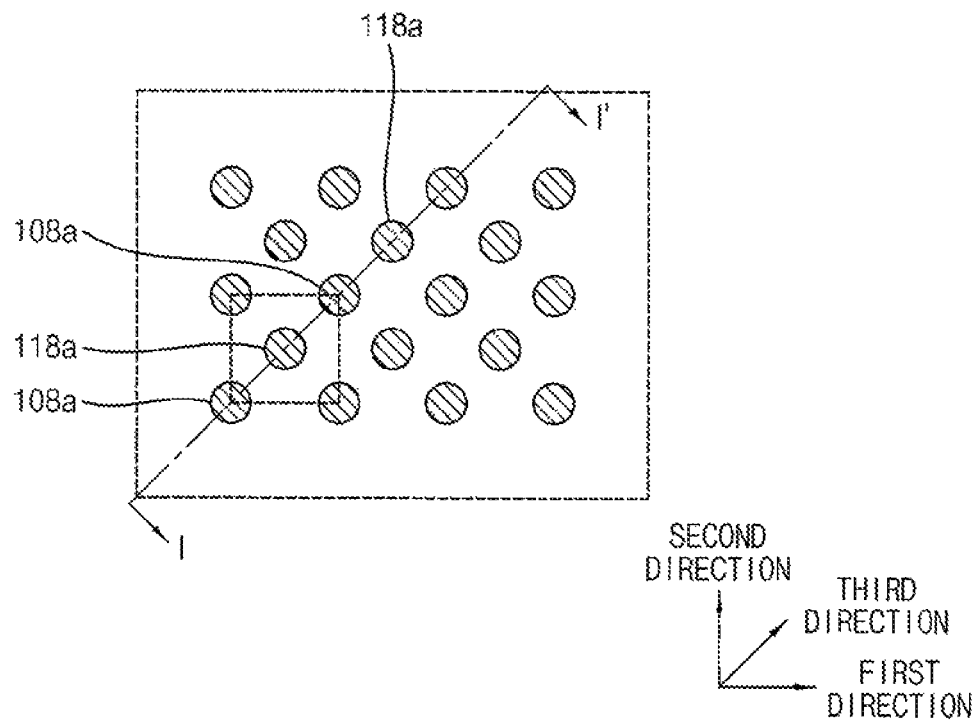

Referring to FIGS. 8A and 8B, the silicon oxide pattern 112a may be isotropically etched, so that a portion of the silicon oxide pattern 112a under the third mask 118a may remain. Thus, a third mask structure 120 including the silicon oxide pattern 112a, the coating pattern 116a and the third mask 118a substantially stacked may be formed.

Each of the second mask 108a and the third mask structure 120 may have a pillar shape having substantially the same diameter. The second mask 108a and the third mask structure 120 may be spaced apart from each other.

Figure 9A:
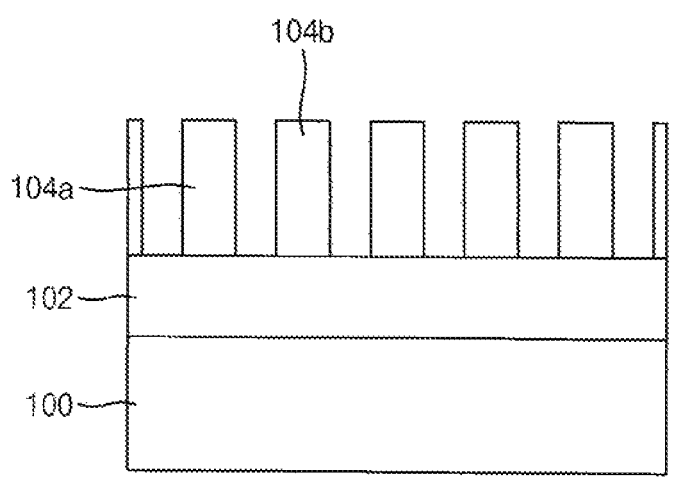
Figure 9B:
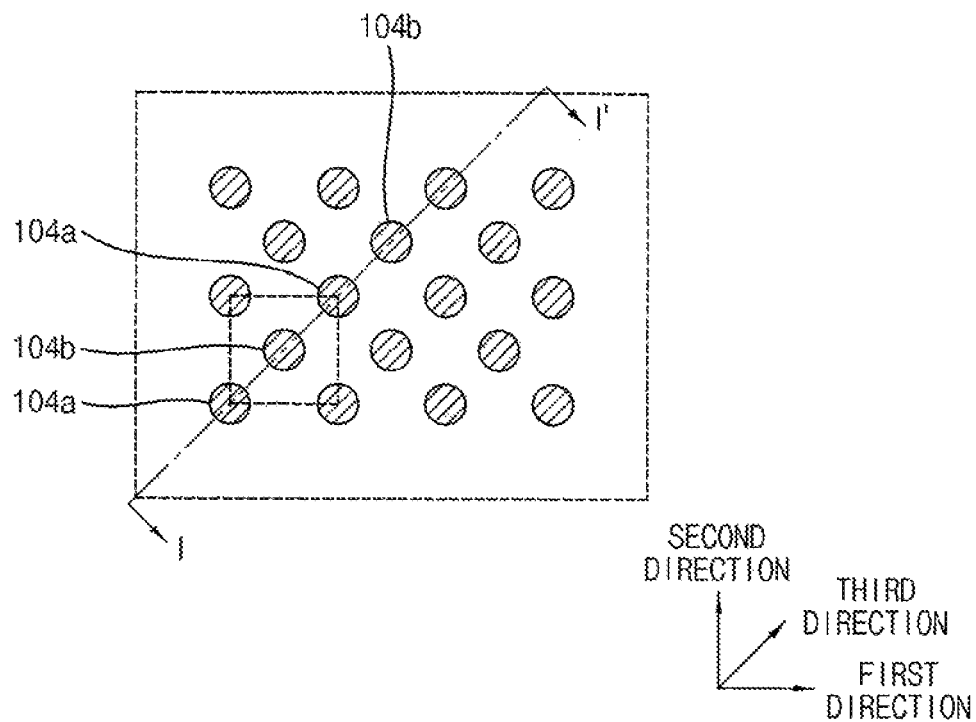
Figure 9C:
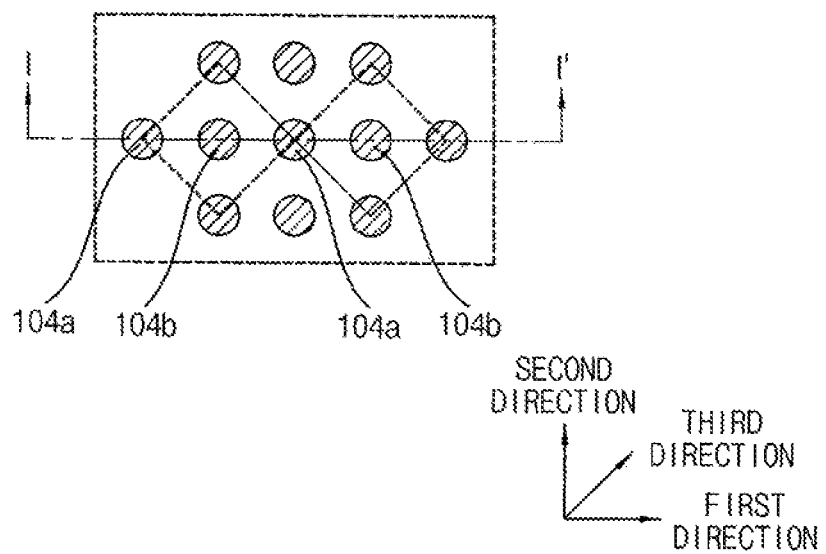
Figure 9D:
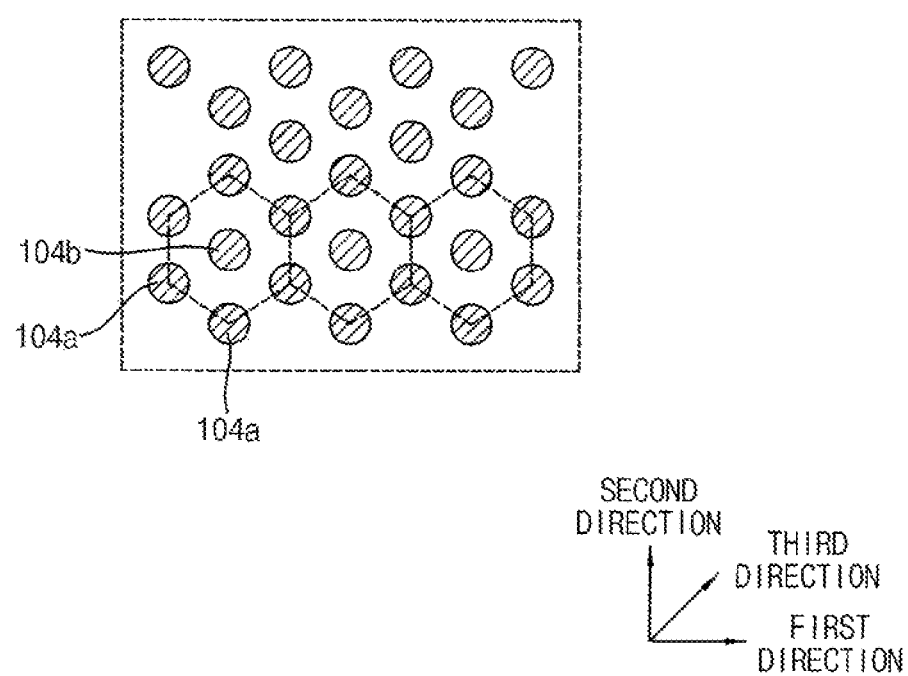

Referring to FIGS. 9A and 9B, the first etch stop layer 106 and the first mask layer 104 may be etched using the second mask 108a and the third mask structure 120 as an etch mask to form the first masks 104a and 104b each having a pillar shape. The first etch stop layer 106 may be removed.

Some of the first masks 104a and 104b may be formed by being transferred from the second mask 108a, and others of the first masks 104a and 104b may be formed by being transferred from the third mask structure 120. However, the first masks 104a formed by being transferred from the second mask 108a may have a shape and a size substantially the same as a shape and a size of the first masks 104b formed by being transferred from the third mask structure 120. Thus, the first masks 104a and 104b may have a uniform critical dimension.

In example embodiments, as shown in FIG. 9B, the first masks 104a and 104b may be formed at vertices and central portions of continuously arranged squares. Two sides of each of the squares may extend in the first direction.

In some example embodiments, the photoresist pattern 114 may be formed to have the arrangement substantially the same as or similar to that illustrated with reference to FIG. 1C. In this case, processes substantially the same as or similar to those illustrated with reference to FIGS. 2A to 9A may be performed. Thus, as shown in FIG. 9C, the first masks 104a and 104b may be formed at vertices and central portions of continuously arranged rhombuses. Two sides of each of the rhombuses may extend in the third direction.

In some example embodiments, the photoresist pattern 114 may be formed to have the arrangement substantially the same as or similar to that illustrated with reference to FIG. 1D. In this case, processes substantially the same as or similar to those illustrated with reference to FIGS. 2A to 9A may be performed. Thus, as shown in FIG. 9D, the first masks 104a and 104b may be formed at vertices and central portions of continuously arranged regular hexagons.

In example embodiments, the lower layer 102 may be etched using the first masks 104a and 104b as an etching mask to form patterns (not shown) having pillar shapes.

In example embodiments, an additional process may be performed with respect to the first masks 104a and 104b to form a mask pattern (not shown) including holes therethrough. The holes may be formed at portions corresponding to the first masks 104a and 104b, respectively. Particularly, a filling layer (not shown) may be formed to fill a gap between the first masks 104a and 104b. The filling layer may be planarized until top surfaces of the first masks 104a and 104b may be exposed, and the first masks 104a and 104b may be removed to form the mask pattern including the holes.

Figure 10A:
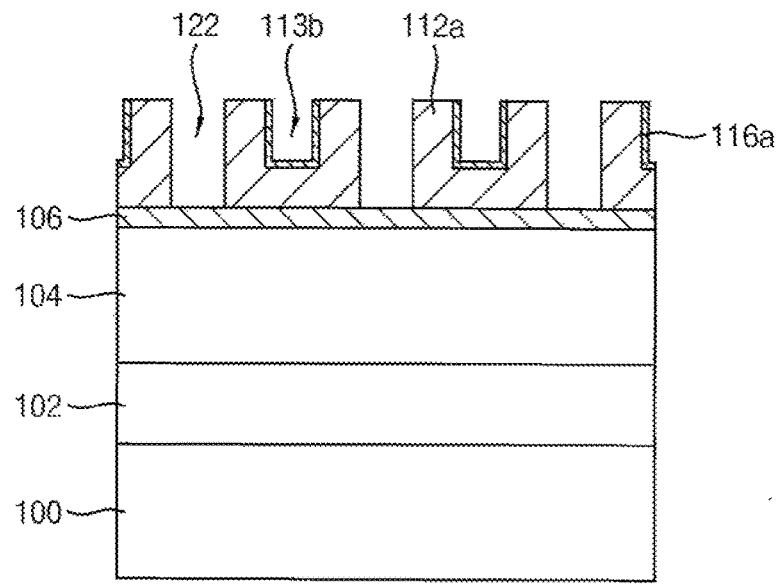
FIGS. 10A and 11A are cross-sectional views illustrating stages of a method of manufacturing a semiconductor device in accordance with example embodiments.
Figure 10B:
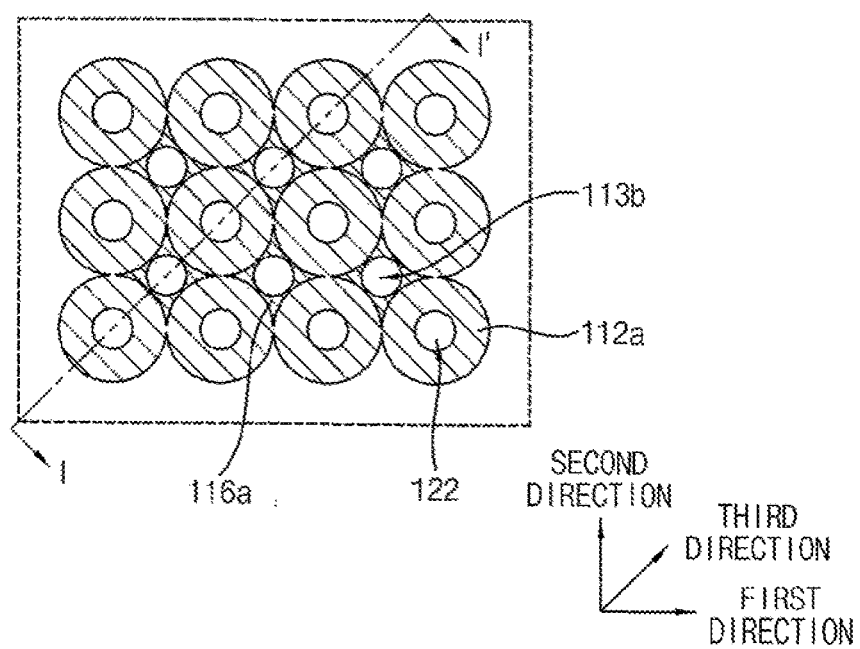
FIGS. 10B and 11B are plan views illustrating the stages of the method of manufacturing the semiconductor device.
Figure 11A:
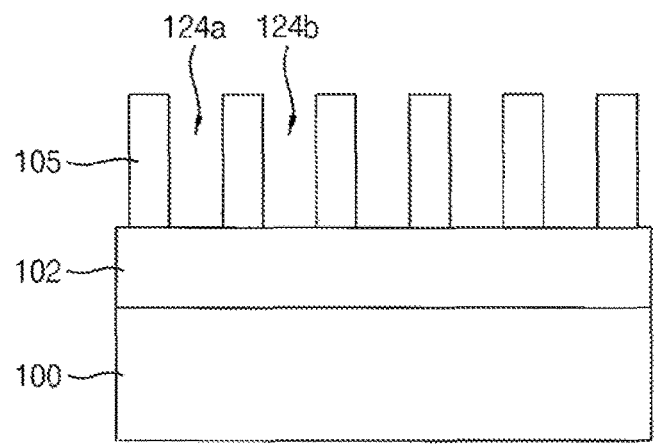
Figure 11B:
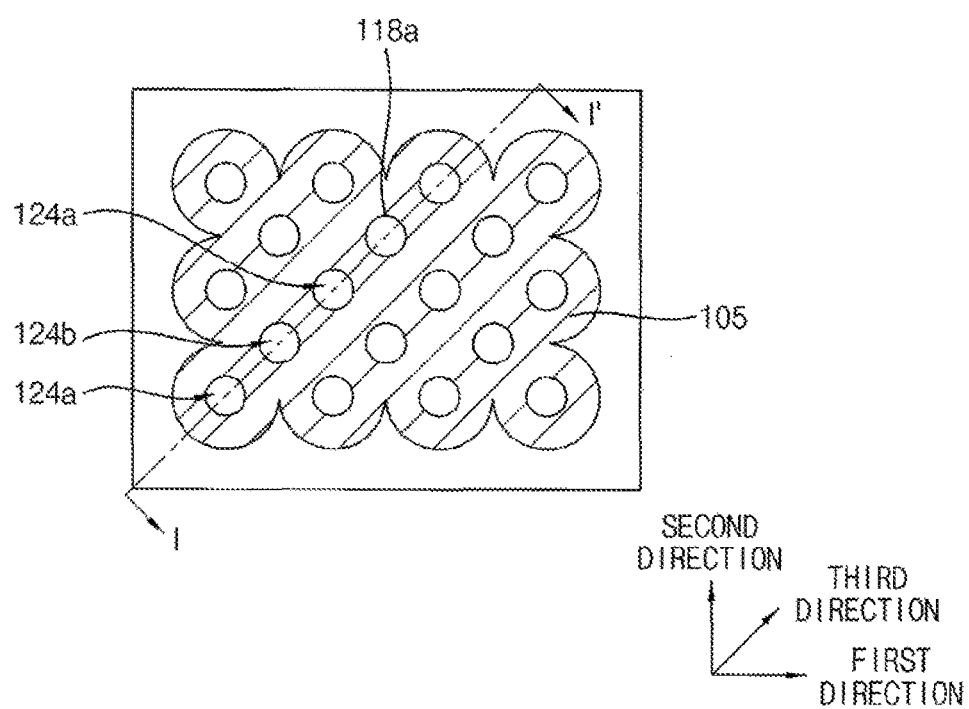

FIGS. 10A and 11A are cross-sectional views illustrating stages of a method of manufacturing a semiconductor device in accordance with example embodiments, and FIGS. 10B and 11B are plan views illustrating the stages of the method of manufacturing the semiconductor device.

The semiconductor device may have a pattern including holes regularly arranged.

Processes substantially the same as or similar to those illustrated with reference to FIGS. 1A and 1B to FIGS. 7A and 7B may be preformed to form a structure shown in FIGS. 7A and 7B.

Referring to FIGS. 10A and 10B, the second mask 108a and the third mask 118a may be etched. Thus, the silicon oxide pattern 112a and the coating pattern 116a may remain on the first etch stop layer 106. The second mask 108a may be removed to form first holes 122 exposing the first etch stop layer 106. The third mask 118a may be removed to form a recess 113b. In example embodiments, a plurality of silicon oxide patterns 112a may be formed to have ring shapes connected to each other, in a plan view.

Referring to FIGS. 11A and 11B, the silicon oxide pattern 112a may be anisotropically etched, so that the coating pattern 116a and a portion of the silicon oxide pattern 112a on a bottom of the recess 113b may be removed to form second holes (not shown) exposing the first etch stop layer 106.

The first etch stop layer 106 and the first mask layer 104 may be sequentially etched using the remaining silicon oxide pattern 112a as an etching mask to form a first mask 105 including third holes 124a and fourth holes 124b therethrough. The third holes 124a may be formed under the first holes 122, and the fourth holes 124b may be formed under the second holes.

In example embodiments, an additional process may be performed with respect to the first mask 105 to form mask patterns (not shown) including pillars. The mask patterns may be formed at portions corresponding to the third and fourth holes 124a and 124b, respectively. Particularly, a filling layer (not shown) may be formed to fill the third and fourth holes 124a and 124b. The filling layer may be planarized until a top surface of the first mask 105 may be exposed, and the first mask 105 may be removed to form the mask patterns including the pillars.

In some example embodiments, the lower layer 102 may be etched using the first mask 105 as an etching mask to form patterns (not shown).

FIGS. 12A, 13A, 14A, 15A and 16A are cross-sectional views illustrating stages of a method of manufacturing a semiconductor device in accordance with example embodiments, and FIGS. 12B, 13B, 14B, 15B and 16B are plan views illustrating the stages of the method of manufacturing the semiconductor device.

The semiconductor device may have a pattern including holes regularly arranged.

Processes substantially the same as or similar to those illustrated with reference to FIGS. 1A and 1B to FIGS. 3A and 3B may be preformed to form a structure shown in FIGS. 3A and 3B.

Figure 12A:
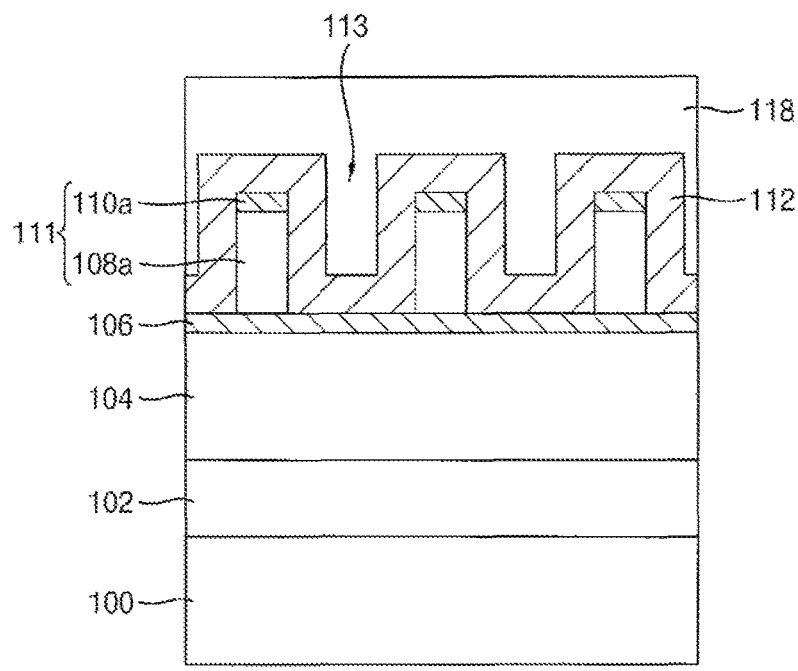
FIGS. 12A, 13A, 14A, 15A and 16A are cross-sectional views illustrating stages of a method of manufacturing a semiconductor device in accordance with example embodiments.
Figure 12B:
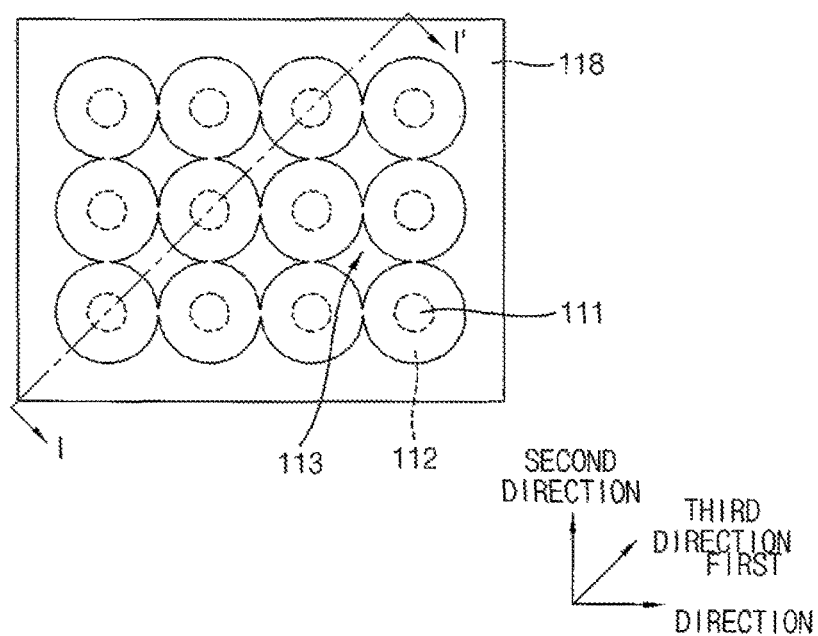
FIGS. 12B, 13B, 14B, 15B and 16B are plan views illustrating the stages of the method of manufacturing the semiconductor device.

Referring to FIGS. 12A and 12B, a third mask layer 118 may be formed on the silicon oxide layer 112 to completely fill the first recess 113 between the second mask structures 111. The third mask layer 118 may be formed of a material substantially the same as a material of the second mask 108a. That is, the third mask layer 118 may be a SOH layer, e.g., a silicon-based SOH layer, a carbon-based SOH layer, etc.

Figure 13A:
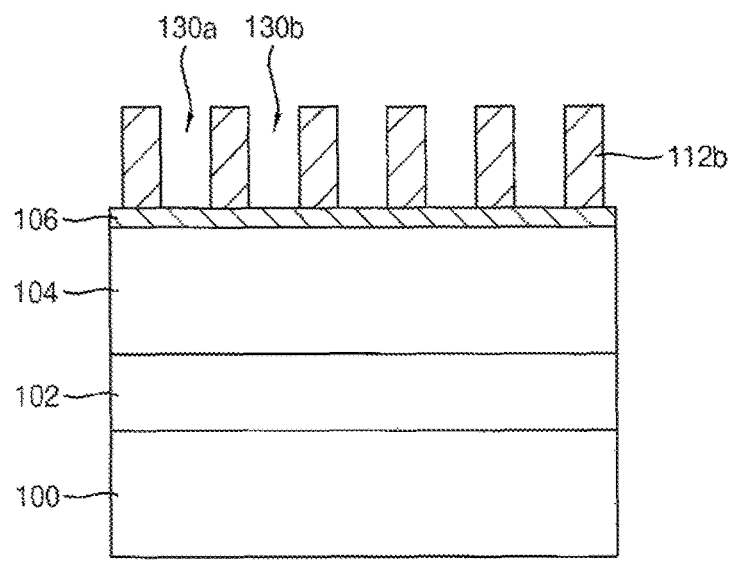
Figure 13B:
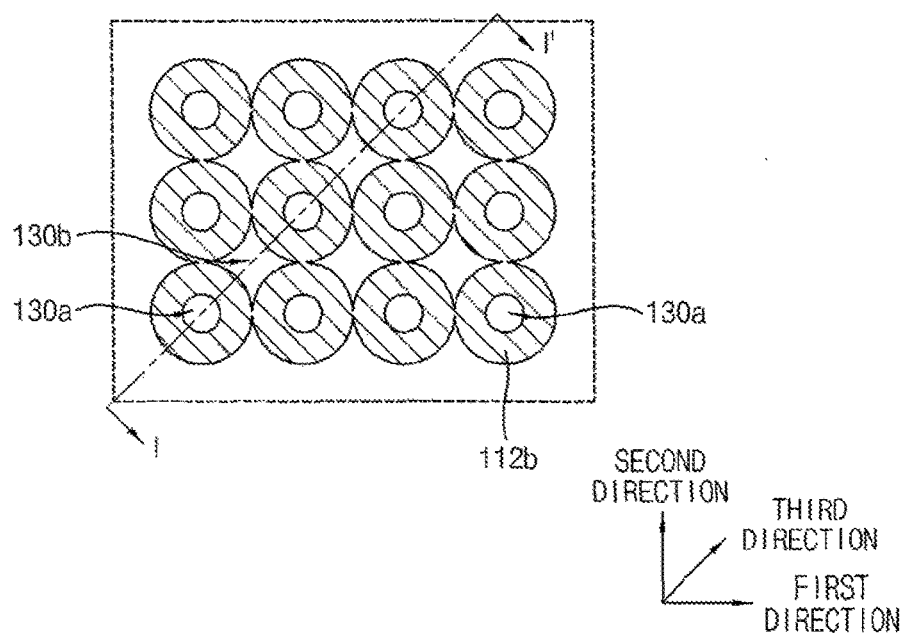

Referring to FIGS. 13A and 13B, the third mask layer 118, the silicon oxide layer 112 and the second etch stop pattern 110a may be planarized until top surfaces of the second masks 108a may be exposed. The planarization process may include an etch back process and/or a chemical mechanical polishing (CMP) process. By the planarization process, the top surfaces of the second masks 108a and third masks (not shown) may be exposed.

The second masks 108a and third masks may be removed to form first holes 130a and a recess (not shown). The first holes 130a may be formed at portions corresponding to the second masks 108a, and the recess may be formed at portions corresponding to the third masks.

The silicon oxide layer 112 may be anisotropically etched to form a second silicon oxide pattern 112b including second holes 130b therethrough. The second holes 130b may be formed at spaces that may be formed by removing portions of the silicon oxide layer 112. In example embodiments, in a plan view, the second holes 130b may have a rhombus shape.

Figure 14A:
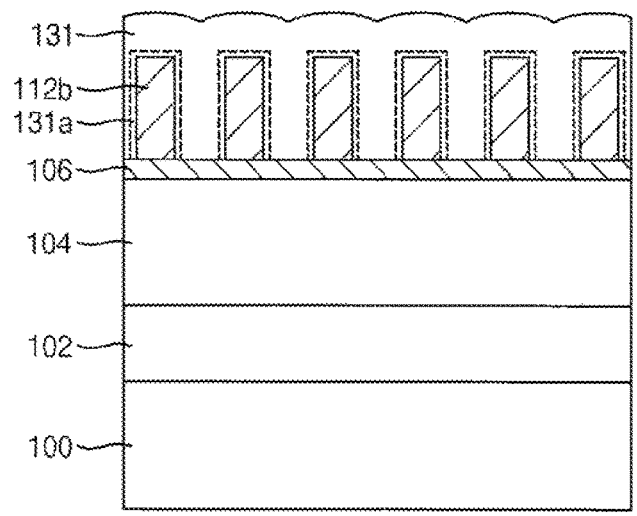
Figure 14B:
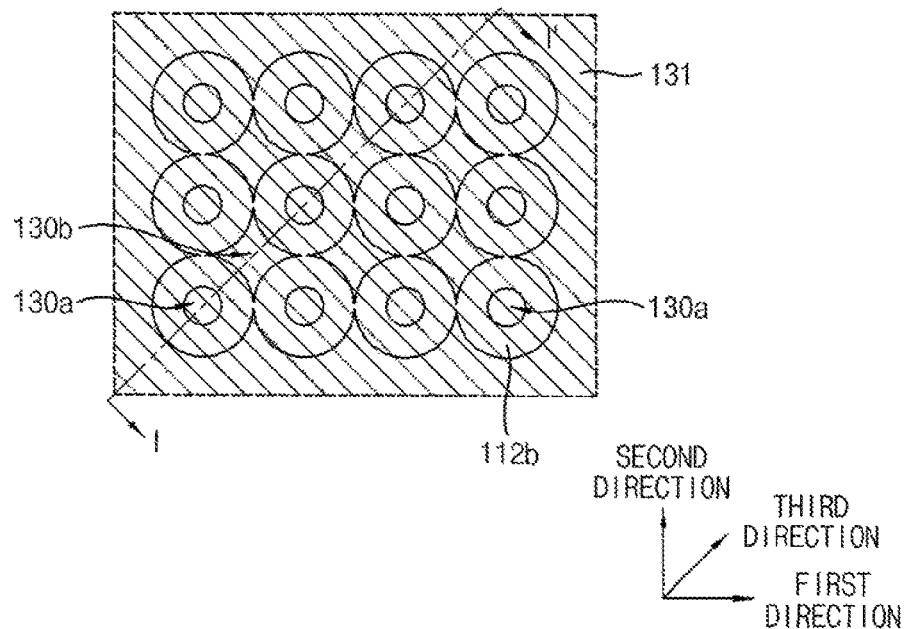

Referring to FIGS. 14A and 14B, a coating layer 131 including silicon may be formed on the second silicon oxide pattern 112b, and may be baked. The formation of the coating layer 131 and the baking process of the coating layer 131 may be substantially the same as or similar to those illustrated with reference to FIGS. 4A and 4B.

By the baking process, a portion of the coating layer 131 on the second silicon oxide pattern 112b may be reacted with the second silicon oxide pattern 112b, so as to be bonded onto the second silicon oxide pattern 112b. That is, the portion of the coating layer 131 may be conformally formed on a surface of the second silicon oxide pattern 112b. Particularly, OH group in the second silicon oxide pattern 112b and silicon in the coating layer 131 may be combined to each other, so that a first portion 131a of the coating layer 131 may be chemically bonded onto the second silicon oxide pattern 112b. A portion of the coating layer 131 on the first etch stop layer 106 including, e.g., silicon oxinitride and/or silicon nitride may not be bonded thereto.

At merged portions of the second silicon oxide pattern 112b in the second holes 130b, a contact surface between the first portion 131a of the coating layer and the silicon oxide pattern 112b may increase due to the 3-dimensional effect. Thus, the first portion 131a of the coating layer on the merged portions of the second silicon oxide pattern 112b in the second holes 130b may be formed to have a thickness greater than thicknesses of other portions of the coating layer 131 on the second silicon oxide pattern 112b.

Figure 15A:
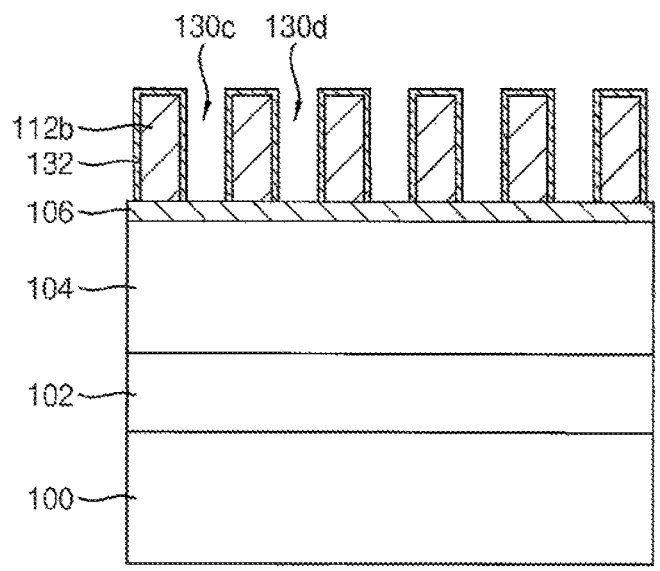
Figure 15B:
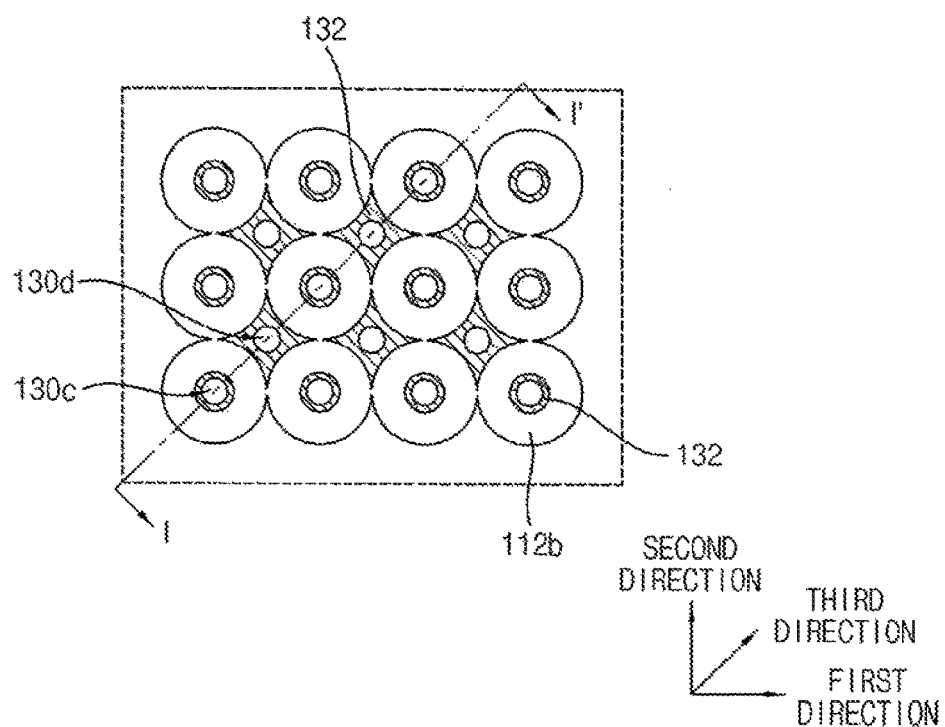

Referring to FIGS. 15A and 15B, a portion of the coating layer 131 not bonded to the second silicon oxide pattern 112b may be removed by a developing process to form a coating pattern 132.

In example embodiments, the developing process may be formed using an organic developer. The organic developer may include, e.g., n-butyl acetate (nBA), 1-methoxy-2-propanol acetate (PGMEA), 1-methoxy-2-propanol (PGME), etc.

The coating pattern 132 may be formed on the second silicon oxide pattern 112b. A portion of the coating pattern 132 on a sidewall of the second silicon oxide pattern 112b may have a thickness greater than a thickness of a portion of the coating pattern 132 on a top surface of the second oxide pattern 112b, due to the reflow of the coating layer 131. Particularly, a portion of the coating pattern 132 on the second silicon oxide patterns 112b in the second hole 130b may have the greatest thickness, due to the increased contact surface of the coating layer 131.

As the coating pattern 132 may be formed on the second silicon oxide pattern 112b, the first and second holes 130a and 130b may be transformed into third and fourth holes 130c and 130d, respectively. Each of the third holes 130c may have a diameter smaller than a diameter of each of the first holes 130a. In a plan view, each of the fourth holes 130d may have a circular shape. Each of the third holes 130c may have a diameter substantially the same as a diameter of each of the fourth holes 130d.

Figure 16A:
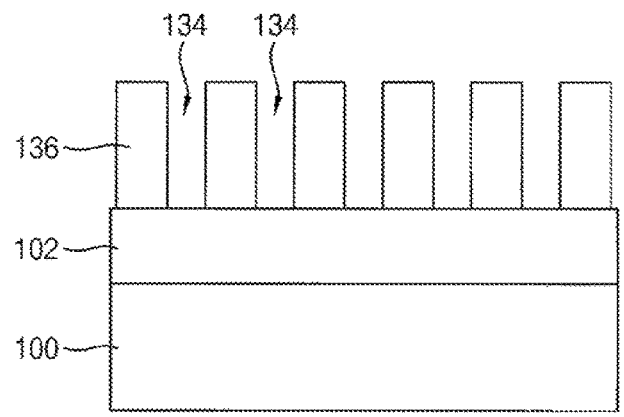
Figure 16B:
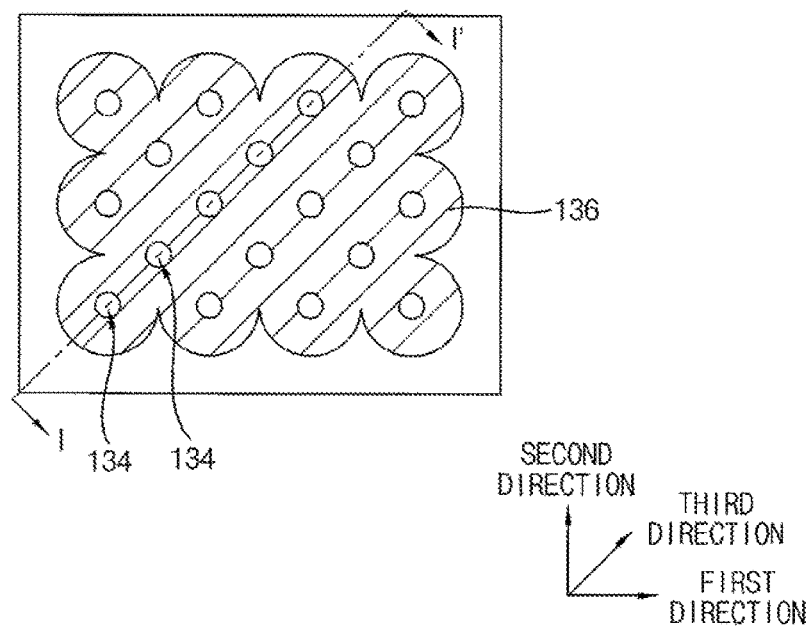

Referring to FIGS. 16A and 16B, the first etch stop layer 106 and the first mask layer 104 may be etched using the second silicon oxide pattern 132 and the coating pattern 112b including the third and fourth holes 130c and 130d as an etching mask to form a first mask 136 including holes regularly arranged.

In example embodiments, the lower layer 102 may be etched using the first mask 136 as an etching mask to form patterns (not shown).

FIGS. 17A, 18A, 19A, 20A, 21A and 22A are cross-sectional views illustrating stages of a method of manufacturing a semiconductor device in accordance with example embodiments, and FIGS. 17B, 18B, 19B, 20B, 21B and 22B are plan views illustrating the stages of the method of manufacturing the semiconductor device. FIG. 17C is a plan view illustrating stages of a method of manufacturing a semiconductor device in accordance with example embodiments. FIG. 17D is a plan view illustrating stages of a method of manufacturing a semiconductor device in accordance with example embodiments.

Figure 17A:
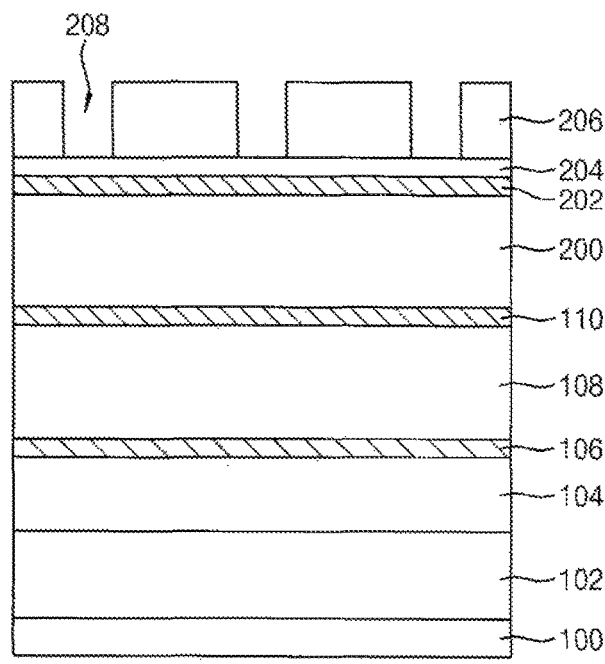
FIGS. 17A, 18A, 19A, 20A, 21A and 22A are cross-sectional views illustrating stages of a method of manufacturing a semiconductor device in accordance with example embodiments.
Figure 17B:
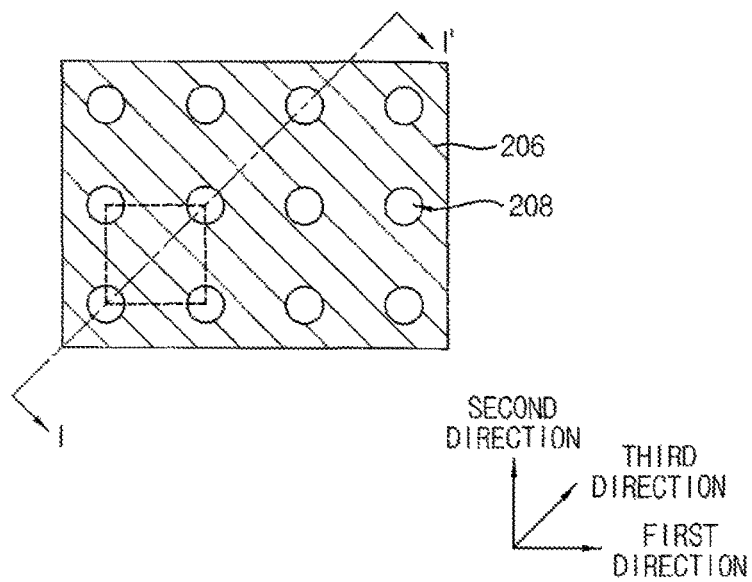
FIGS. 17B, 18B, 19B, 20B, 21B and 22B are plan views illustrating the stages of the method of manufacturing the semiconductor device.
Figure 17C:
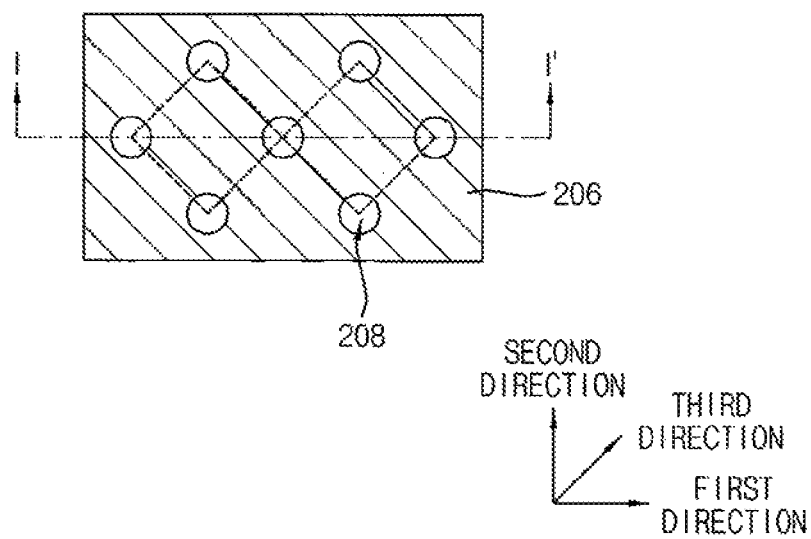
FIG. 17C is a plan view illustrating stages of a method of manufacturing a semiconductor device in accordance with example embodiments.
Figure 17D:
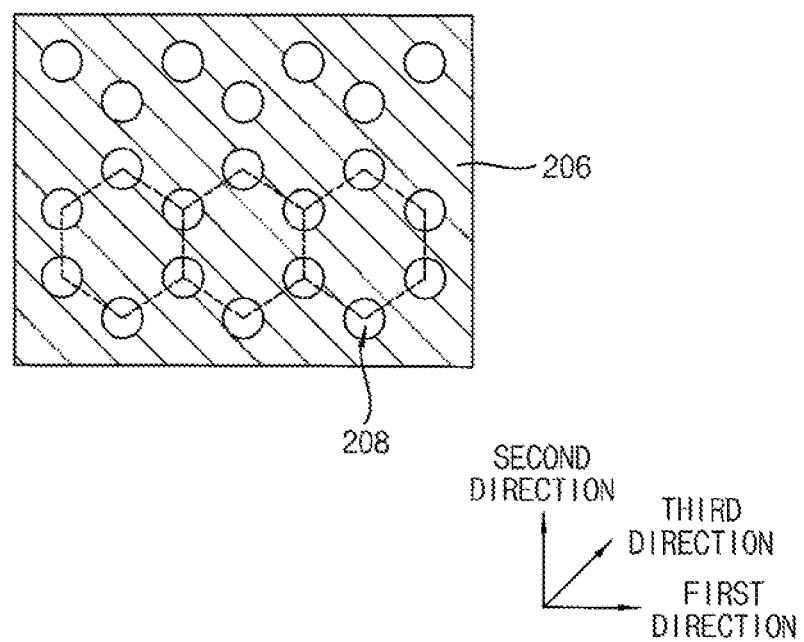
FIG. 17D is a plan view illustrating stages of a method of manufacturing a semiconductor device in accordance with example embodiments.

Referring to FIGS. 17A and 17B, a lower layer 102 may be formed on a substrate 100. A first mask layer 104, a first etch stop layer 106, a second mask layer 108, a second etch stop layer 110, a third mask layer 200, a third etch stop layer 202 and a BARC layer 204 may be sequentially formed on the lower layer 102. A photoresist pattern 206 may be formed on the BARC layer 204 by a photo process.

The lower layer 102 may be an etch target layer. The first mask layer 104 may be formed of a material having a high etching selectivity with respect to the lower layer 102.

The first etch stop layer 106 may be formed of a material having a high etching selectivity with respect to the second mask layer 108. The second etch stop layer 110 may be formed of a material having a high etching selectivity with respect to the third mask layer 200, and the third etch stop layer 202 may be formed of a material having a high etching selectivity with respect to silicon oxide. In some embodiments, each of the first, second and third etch stop layers 106, 110 and 202 may be formed of silicon nitride, silicon oxynitride, etc.

The second and third mask layers 108 and 200 may be a SOH layer, e.g., a silicon-based SOH layer, a carbon-based SOH layer, etc. In example embodiments, the carbon-based SOH layer may include an ACL or a carbon-containing layer.

Figure 22A:
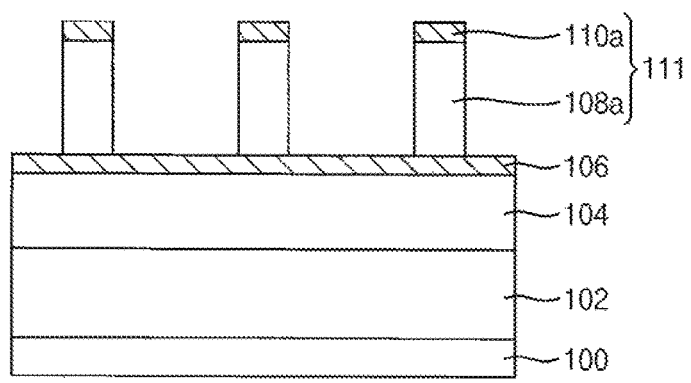
Figure 22B:
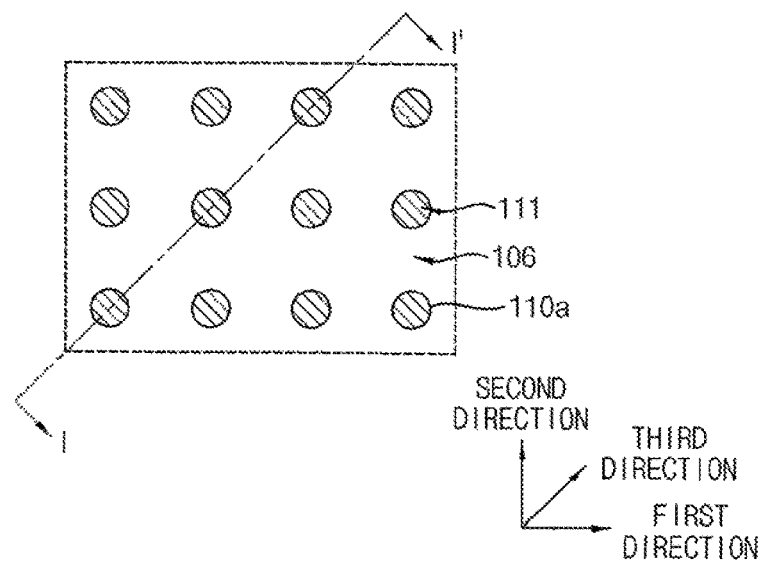

The third mask layer 200 may serve as a sacrificial layer for forming a second mask 108a (refer to FIGS. 22A and 22B).

The photoresist pattern 206 may be formed to include holes regularly arranged.

In example embodiments, as shown in FIG. 17B, the holes 208 of the photoresist pattern 206 may be disposed at vertices of continuously arranged squares, respectively. Two sides of each of the squares may extend in the first direction. That is, the holes 208 of the photoresist pattern 206 may be arranged in the first and second directions.

In some example embodiments, as shown in FIG. 17C, the holes 208 of the photoresist pattern 206 may be disposed at vertices of continuously arranged rhombuses, respectively. Two sides of each of the rhombuses may extend in a third direction having an acute angle with the first direction. That is, the holes 208 of the photoresist pattern 206 may be arranged in the third direction.

In some example embodiments, as shown in FIG. 17D, the holes 208 of the photoresist pattern 206 may be disposed at vertices of continuously arranged regular hexagons, respectively.

Hereinafter, only the case in which the photoresist pattern 206 may be disposed at the vertices of continuously arranged squares, respectively, will be illustrated.

Figure 18A:
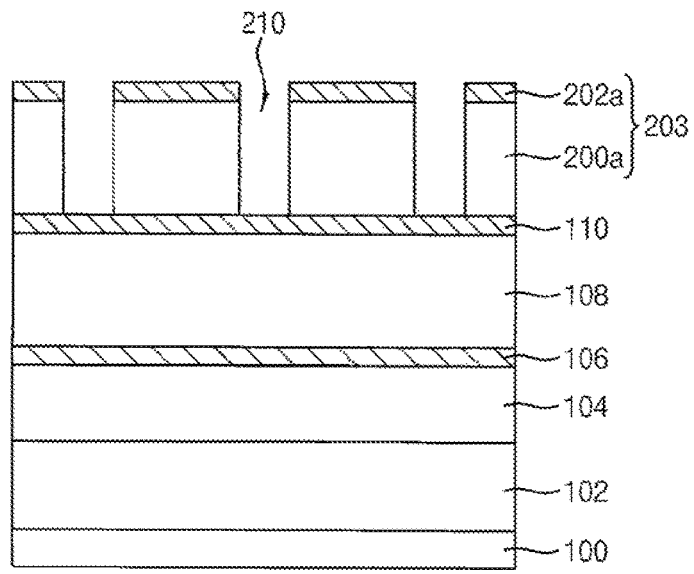
Figure 18B:
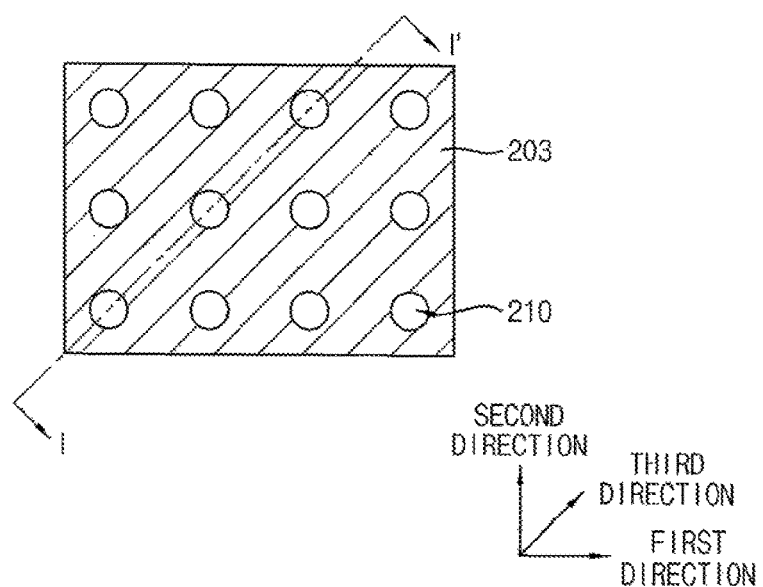

Referring to FIGS. 18A and 18B, the BARC layer 204, the third etch stop layer 202, and the third mask layer 200 may be sequentially etched using the photoresist pattern 206 as an etching mask until a top surface of the second etch stop layer 110 may be exposed, and the photoresist pattern 206 and the BARC layer 204 may be removed by an ashing process and/or a stripping process. Thus, a third mask structure 203 including a third mask 200a and a third etch stop pattern 202a sequentially stacked may be formed.

The third mask structure 203 may include holes 210 arranged in the same manner as the arrangement of the holes 208 of the photoresist pattern 206.

Figure 19A:
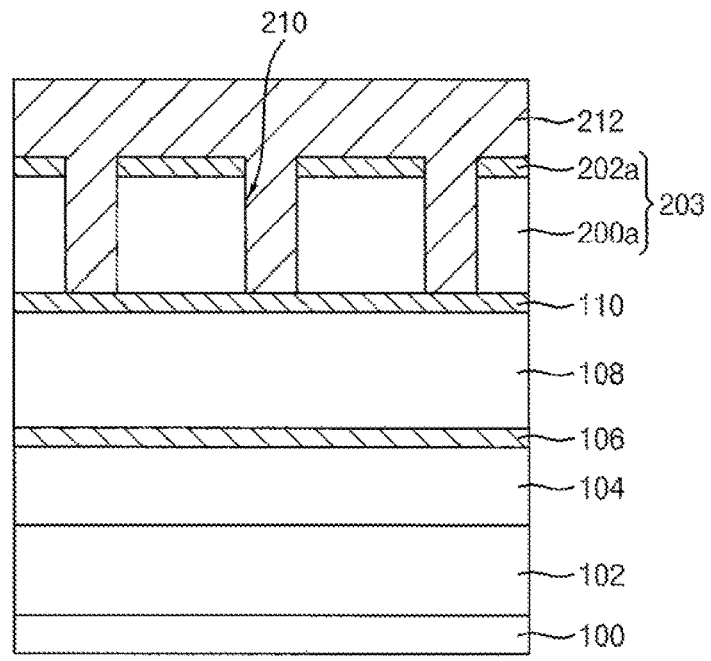
Figure 19B:
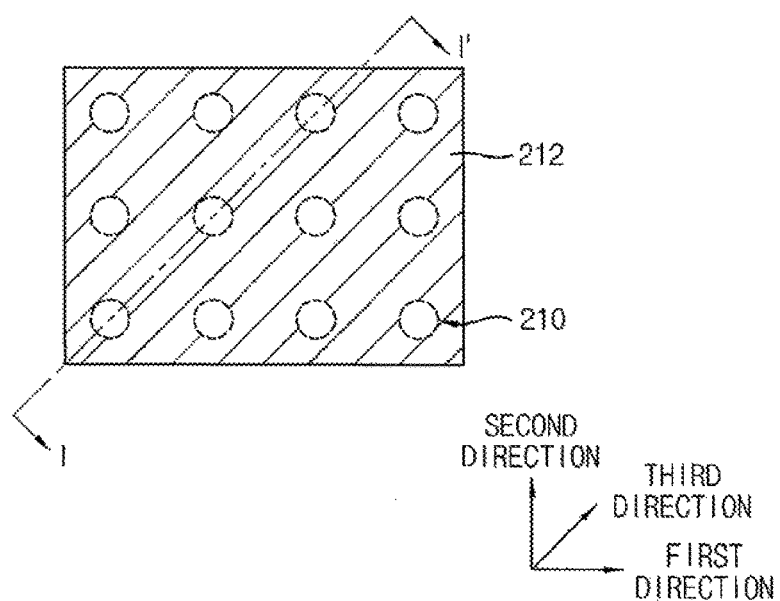

Referring to FIGS. 19A and 19B, a filling layer 212 may be formed on the third mask structure 203 to fill the holes 210. In example embodiments, the filling layer 212 may include silicon oxide. The filling layer 212 may be formed by an ALD process, a CVD process or a spin coating process.

Figure 20A:
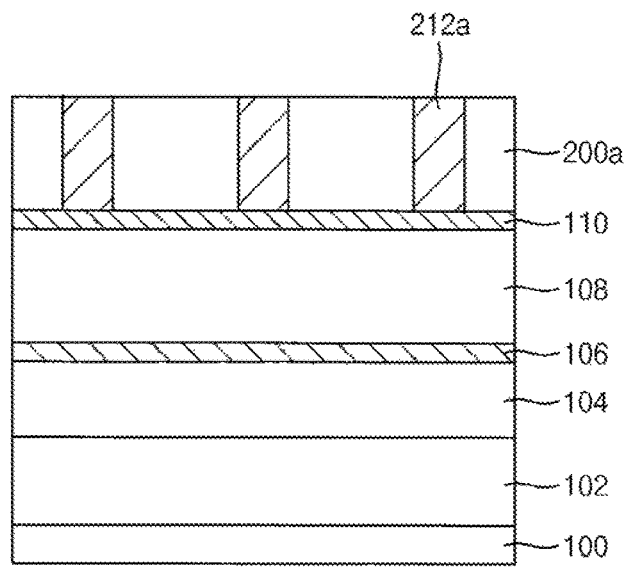
Figure 20B:
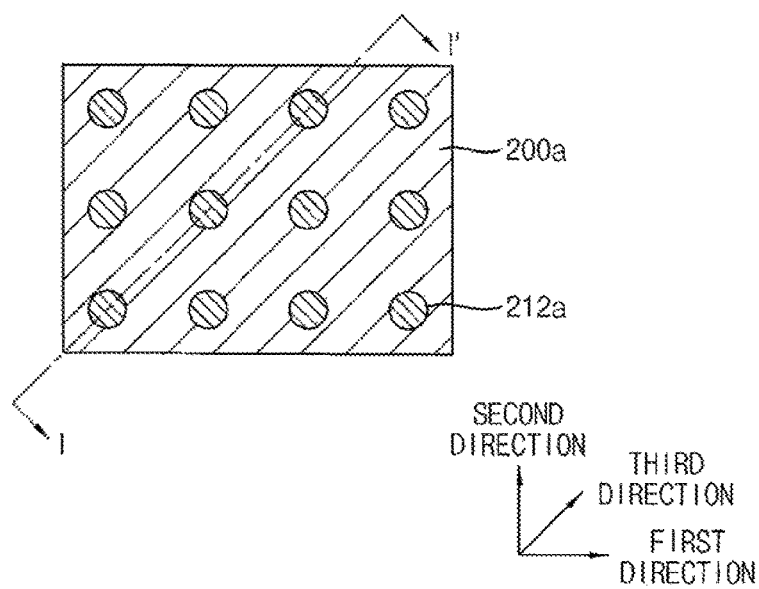

Referring to FIGS. 20A and 20B, the filling layer 212 and the third etch stop layer 202 may be planarized until a top surface of the third mask 200a may be exposed, so that a portion of the filling layer 212 and the third etch stop pattern 202a may be removed to form a filling pattern 212a in each of the holes 210. The third mask 200a may be formed between the filling patterns 212a.

The planarization process may include an etch back process and/or a chemical mechanical polishing (CMP) process.

Figure 21A:
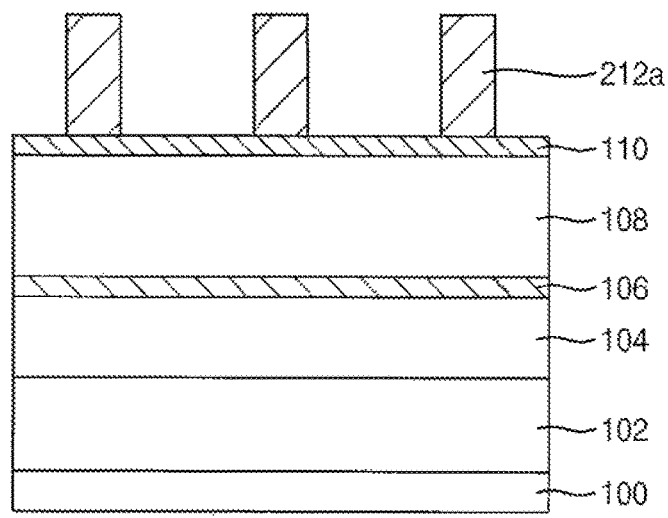
Figure 21B:
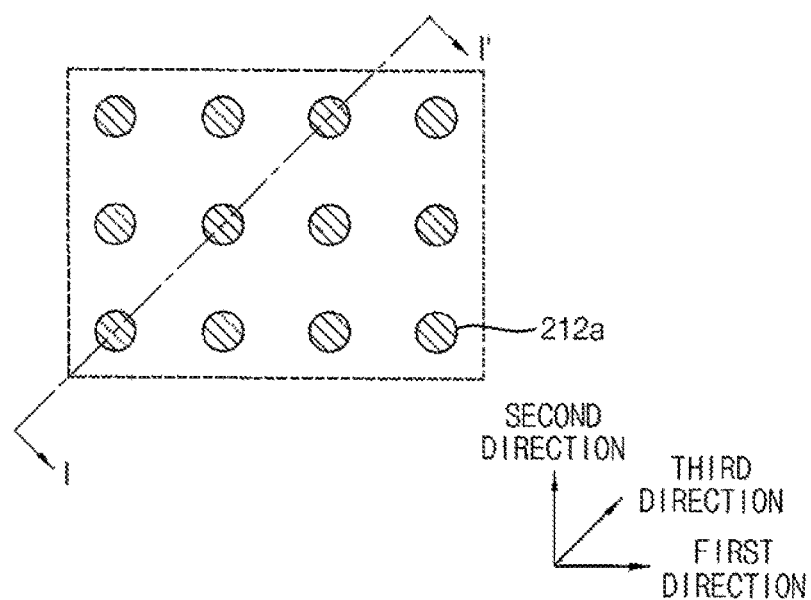

Referring to FIGS. 21A and 21B, the third mask 200a may be removed. Thus, the filling pattern 212a having a pillar shape may be formed on the second etch stop layer 110.

In example embodiments, the filling pattern 212a may be formed to have an arrangement substantially the same as or similar to the arrangement of the holes 208 of the photoresist pattern shown in FIG. 16B.

Referring to FIGS. 22A and 22B, the second etch stop layer 110 and the second mask layer 108 may be etched using the filling patterns 212a as an etching mask to form a second mask structure 111 including the second mask 108a and a second etch stop pattern 110a sequentially stacked. The filling pattern 212a may be removed.

In example embodiments, the second mask structure 111 may be formed to have an arrangement and a shape substantially the same as or similar to the arrangement and the shape of the holes 208 of the photoresist pattern 206. The second mask structure 111 and layers under the second mask 111 structure may be substantially the same as layers illustrated with reference to FIGS. 2B and 2B, respectively.

Then, processes substantially the same as or similar to those illustrated with reference to FIGS. 3A and 3B to FIGS. 9A and 9B may be performed to form the semiconductor device as shown in FIGS. 9A and 9B.

In some example embodiments, when the holes 208 of the photoresist pattern 206 is disposed as shown in FIG. 17C, the semiconductor device shown in FIG. 9C may be formed by performing the processes.

In some example embodiments, when the photoresist pattern 206 is disposed as shown in FIG. 17D, the semiconductor device shown in FIG. 9D may be formed by performing the processes.

FIGS. 23 to 34 are cross-sectional views and plan views illustrating stages of a method of manufacturing the semiconductor device in accordance with example embodiments.

Figure 23:
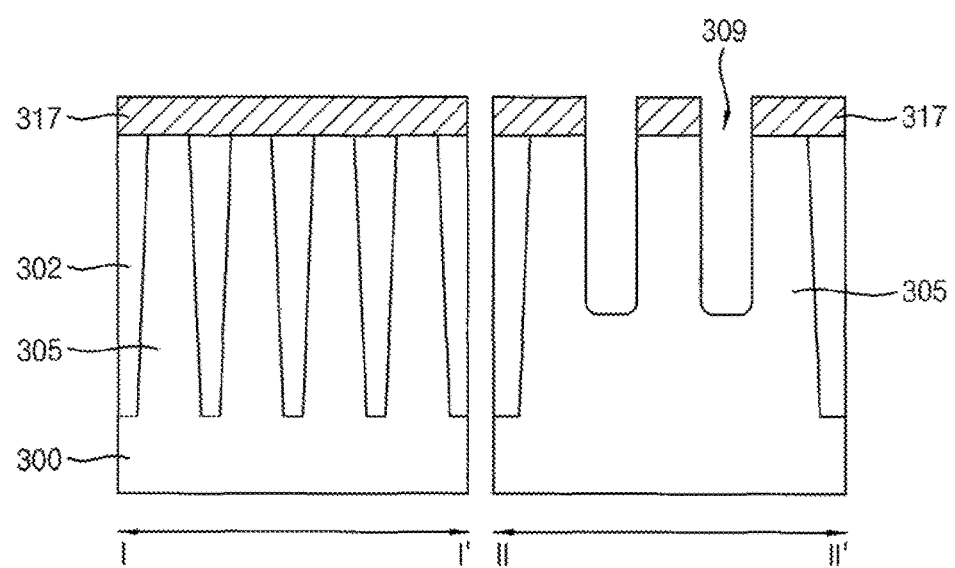
Figure 24:
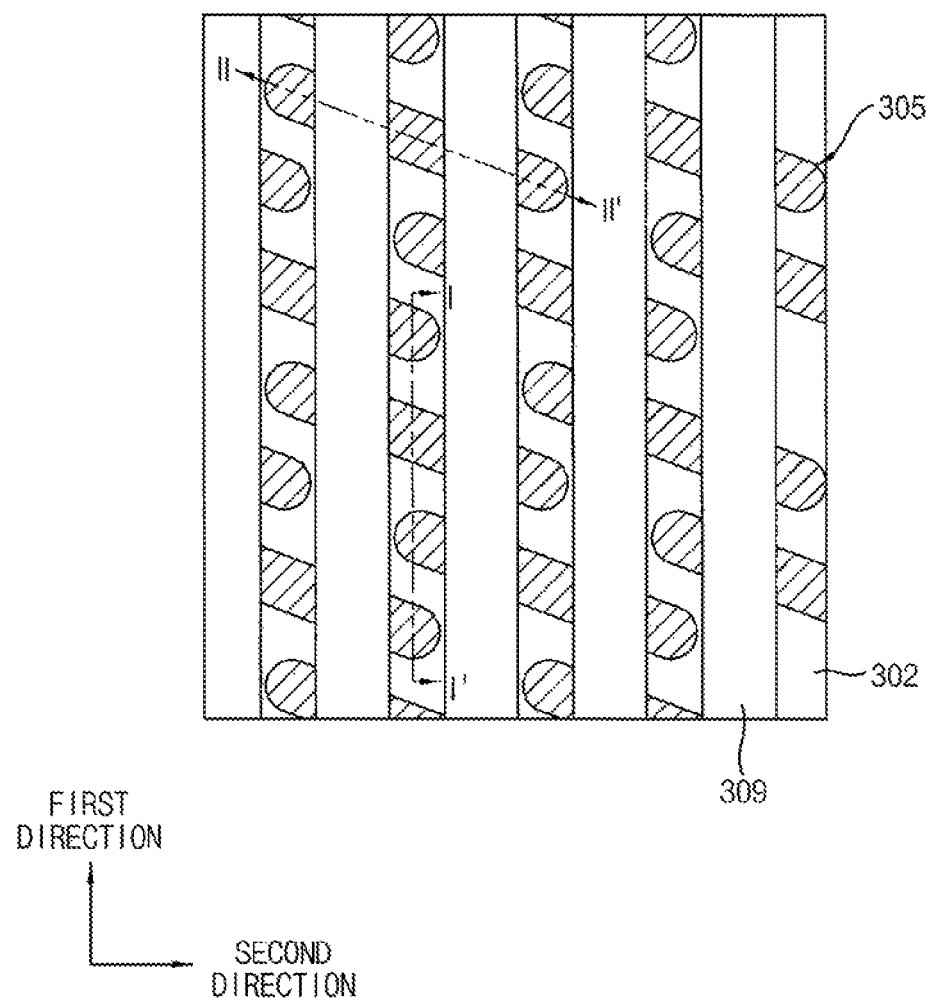
Figure 25:
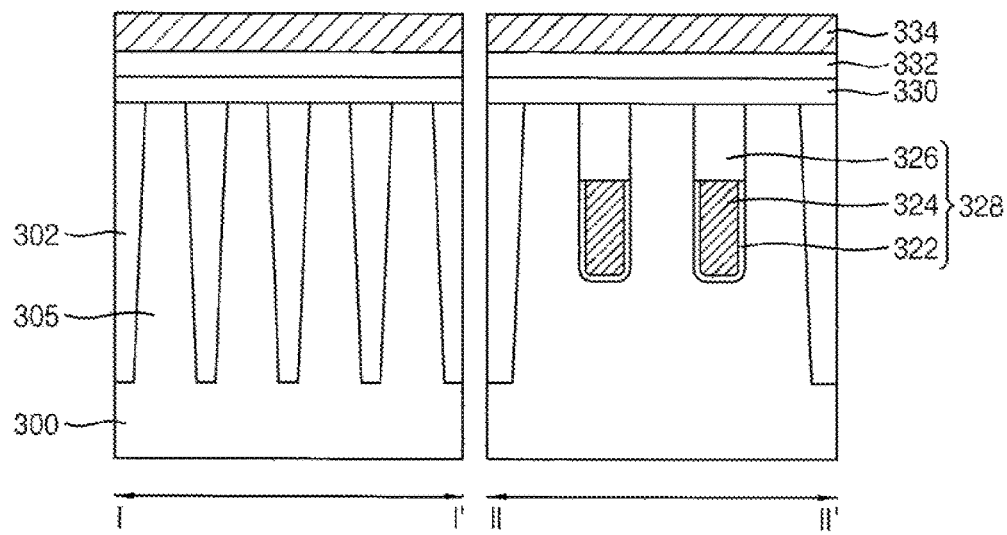
Figure 26:
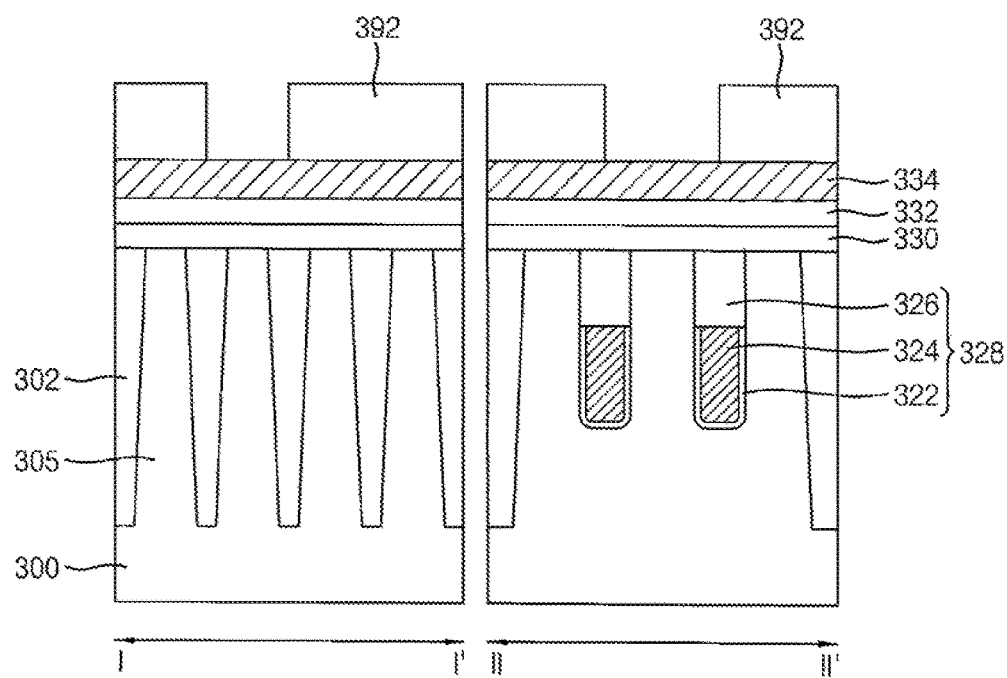
Figure 27:
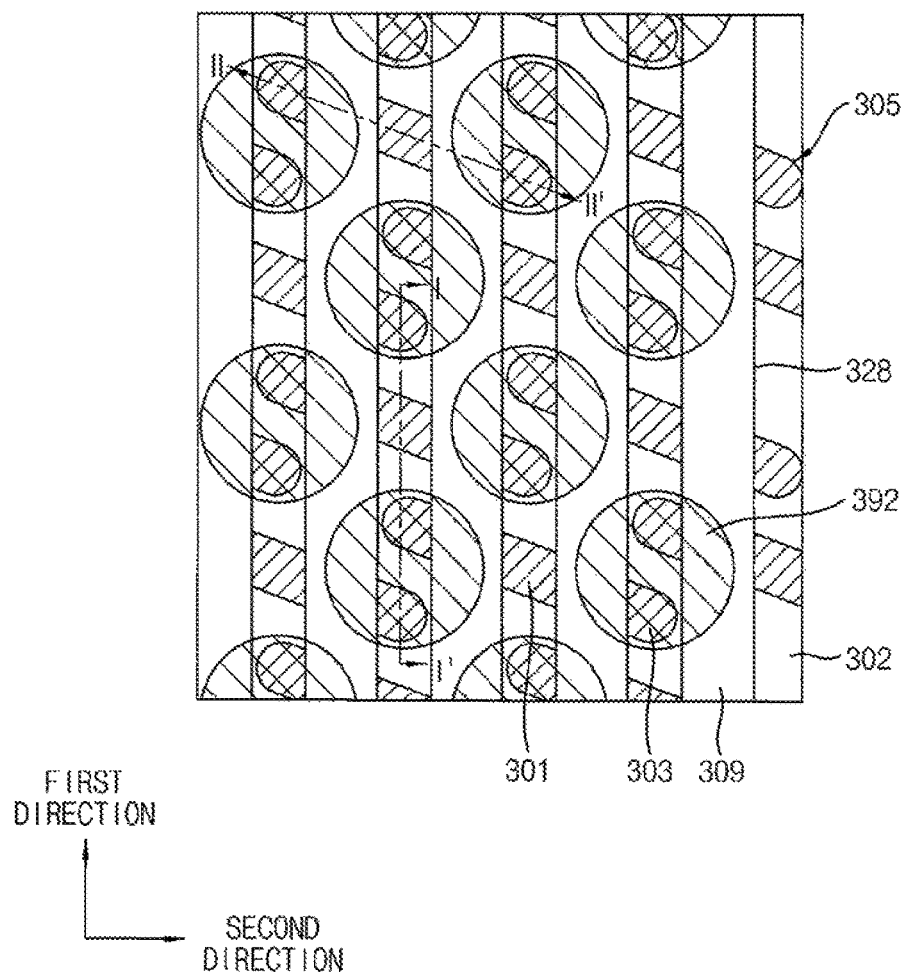
Figure 29:
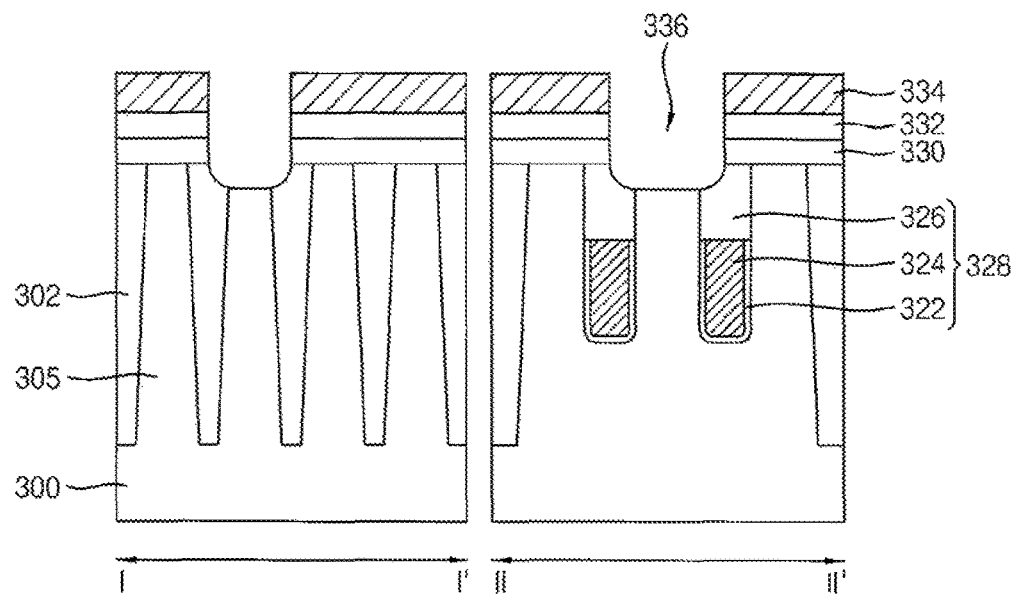

Particularly, FIGS. 23, 25, 26 and 29 to 34 are cross-sectional views, and FIGS. 24, 27 and 29 are cross-sectional views.

Referring to FIGS. 23 and 24, a plurality of active patterns 305 and an isolation layer 302 may be formed on the substrate 300 by a shallow trench isolation (STI) process. Particularly. an upper portion of the substrate 300 may be anisotropically etched to form trenches. Portions of the substrate 300 between the trenches may be referred to as active patterns 305, which may serve as active regions. An insulation layer may be formed on the substrate 300 to fill the trenches. The insulation layer may include, e.g., silicon oxide. The insulation layer may be planarized by a CMP process until a top surface of the active patterns 305 may be exposed to form the isolation layer 302.

In example embodiments, each of the active patterns 305 may extend in a direction having an acute angle with a first direction.

A first hard mask 317 may be formed on the isolation layer 302 and the active patterns 305, and may extend in the first direction.

The isolation layer 302 and the active patterns 305 may be anisotropically etched using the first hard mask 317 as an etching mask to form a gate trench 309 extending in the first direction.

Referring to FIG. 25, a gate structure 328 may be formed to fill the gate trench 309.

Particularly, a gate insulation layer may be conformally formed on a sidewall and a bottom surface of the gate trench 309. In example embodiments, the gate insulation layer may be formed of silicon oxide by a thermal oxidation process. Alternatively, the gate insulation layer may be formed of silicon oxide or a metal oxide by a CVD process.

A gate electrode layer may be formed on the gate insulation layer to sufficiently fill the gate trench 309. The gate electrode layer may be planarized by a CMP process until top surfaces of the active patterns 305 may be exposed, and the gate electrode layer and gate insulation layer may be partially etched by an etch back process to form a gate electrode 324 and a gate insulation pattern 322 filling a lower portion of each of the gate trench 309.

A mask layer may be formed on the gate electrode 324 and the gate insulation pattern 322 to fill a remaining portion of the gate trench 309, and may be planarized by a CMP process and/or an etch back process until the top surfaces of the active patterns 305 may be exposed to form a gate mask 326. Thus, a gate structure 328 including the gate insulation pattern 322, the gate electrode 324 and the gate mask 326 substantially stacked may be formed in the gate trench 309.

Impurities may be implanted into the active patterns adjacent to the gate structure 328 to form impurity regions (not shown).

An etch stop layer 330 may be formed to cover the active patterns 305, the isolation layer 302 and the gate structure 328. A first insulating interlayer 332 may be formed on the etch stop layer 330. A first conductive layer 334 may be formed on the first insulating interlayer 332.

Referring to FIG. 26, a first mask 392 may be formed on the first conductive layer 334.

In example embodiments, referring to FIG. 27, the first mask 392 may be formed to have a pillar shape. The first mask 392 may only cover a storage node contact region 303 of each of the active patterns 305, and bit line contact regions 301 of the active patterns may not covered by the first mask 392. In example embodiments, the first mask 392 may cover neighboring two storage node contact regions 305, so that neighboring two storage node contacts may be subsequently formed on different active patterns 305, respectively. In this case, the first mask 392 may be formed by one of the processes for forming a first mask having a pillar shape, in accordance with example embodiments. In example embodiments, the first mask 392 may be formed by processes substantially the same as or similar to those illustrated with reference to FIGS. 1 and 1B to 9A and 9B. Alternatively, the first mask 392 may be formed by processes substantially the same as or similar to those illustrated with reference to FIGS. 17A and 17B to 22A and 22B.

Figure 28:
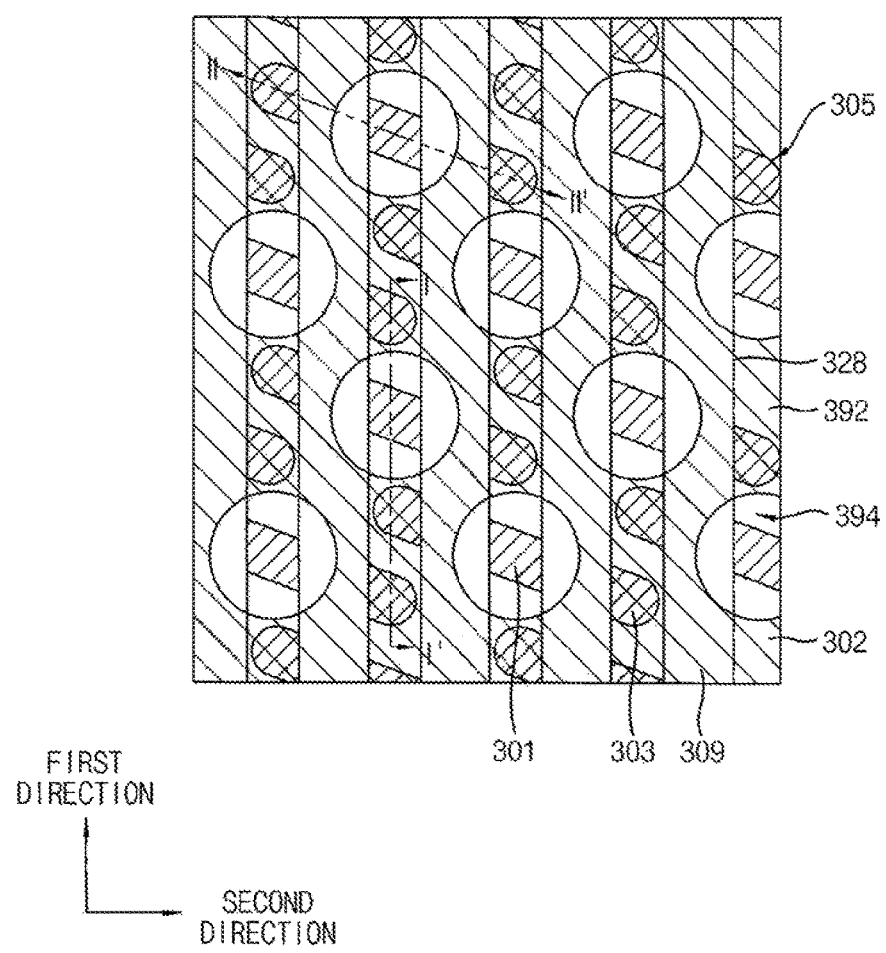

In some example embodiments, referring to FIG. 28, the first mask 392 including holes may be formed on the first conductive layer 334. The first mask 392 may only expose the bit line contact regions 301 of the active patterns through the holes, respectively, and may cover the other portion of the first conductive layer 334. In example embodiments, the first mask 392 may be formed by one of the processes for forming a first mask having holes, in accordance with example embodiments. In example embodiments, the first mask 392 may be formed by processes substantially the same as or similar to those illustrated with reference to FIGS. 10 and 10B and 11A and 11B. Alternatively, the first mask 392 may be formed by processes substantially the same as or similar to those illustrated with reference to FIGS. 12A and 12B to 16A and 16B.

Referring to FIG. 29, the first conductive layer 334, the first insulating interlayer 332 and the etch stop layer 330 may be etched using the first mask 392 as an etching mask to form a first hole 336 exposing the active pattern between the gate structures 328.

In example embodiments, when the first mask 392 has a pillar shape, a portion between the first mask 392 and the gate mask 326 may be etched to form the first hole 336.

In some example embodiments, when the first mask 392 includes holes, a portion between the first gate structures in each of the holes may be etched to form the first hole 336.

Figure 30:
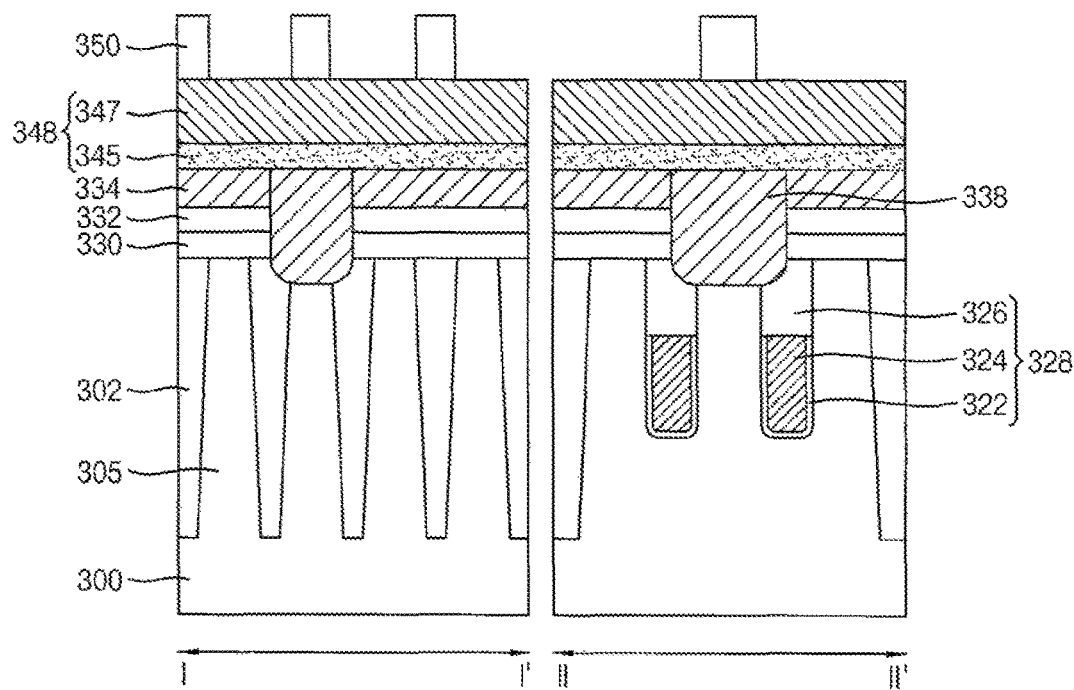

Referring to FIG. 30, a second conductive layer 338 may be formed on the first conductive layer 334 to fill the first hole 336. The second conductive layer 338 may be formed of a material substantially the same as a material of the first conductive layer 334.

In example embodiments, the first and second conductive layers 334 and 338 may be formed of doped polysilicon.

An upper surface of the second conductive layer 338 may be planarized until a top surface of the first conductive layer 334 may be exposed. Thus, top surfaces of the first and second conductive layers 334 and 338 may be substantially coplanar with each other.

A third conductive layer 348 may be formed on the first and second conductive layers 334 and 338. The third conductive layer 348 may include a barrier metal layer 345 and metal layer 347 subsequently stacked.

A second hard mask 350 may be formed on the third conductive layer 348, and may extend in a second direction substantially perpendicular to the first direction.

Figure 31:
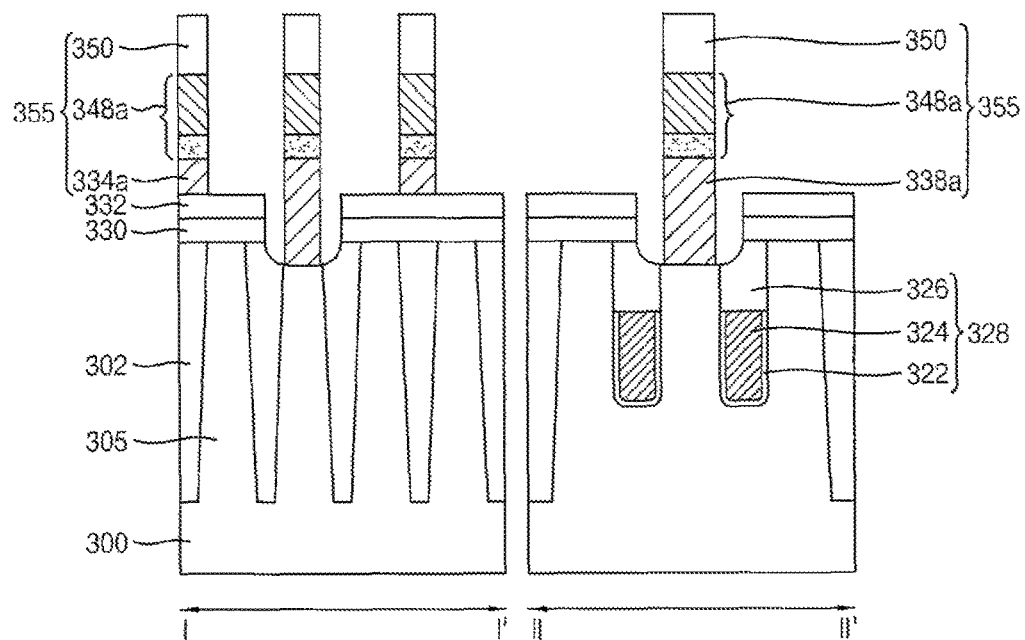

Referring to FIG. 31, the first, second and third conductive layers 335, 338 and 348 may be anisotropically etched using the second hard mask 350 as an etching mask to form the bit line structure 355. The bit line structure 355 may include a first conductive pattern 334a, a second conductive pattern 338a, a third conductive pattern 348a and the second hard mask 350 sequentially stacked.

In example embodiments, a width of the bit line structure 355 in the first direction may be smaller than a width of the first hole 336 in the first direction. Thus, the bit line structure 355 may be formed at an inside of the first hole 336, and sidewalls of the bit line structure 355 and a sidewall of the first hole 336 may be spaced apart from each other.

Figure 32:
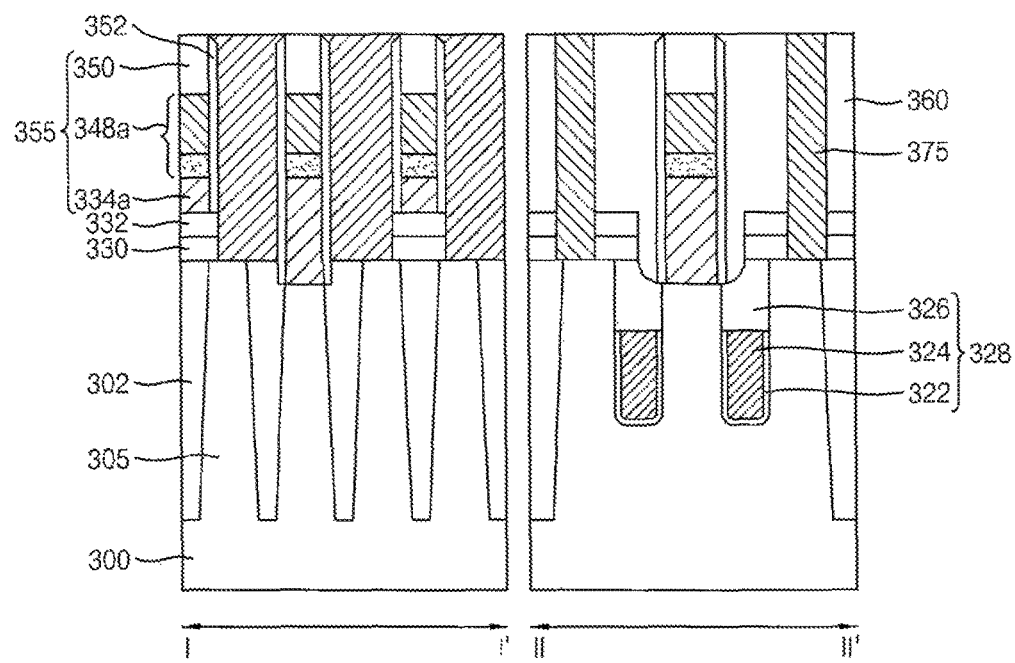

Referring to FIG. 32, spacers 352 may be formed on sidewalls of the bit line structure 355.

A second insulating interlayer 360 may be formed on the first insulating interlayer 332 to cover the bit line structure 355. In example embodiments, an upper portion of the second insulating interlayer 360 may be planarized to have a flat top surface.

The second insulating interlayer 360, the first insulating interlayer 332 and the etch stop layer 330 may be etched to form a contact hole exposing top surfaces of the active patterns 305.

A contact plug 375 may be formed to fill the contact hole. The contact plug 375 may be electrically connected to each of the active patterns 305, and may serve as the storage node contact. Particularly, a conductive layer may be formed to fill the contact hole, and planarized to expose a top surface of the second mask by a CMP process to form the contact plug 375.

Figure 33:
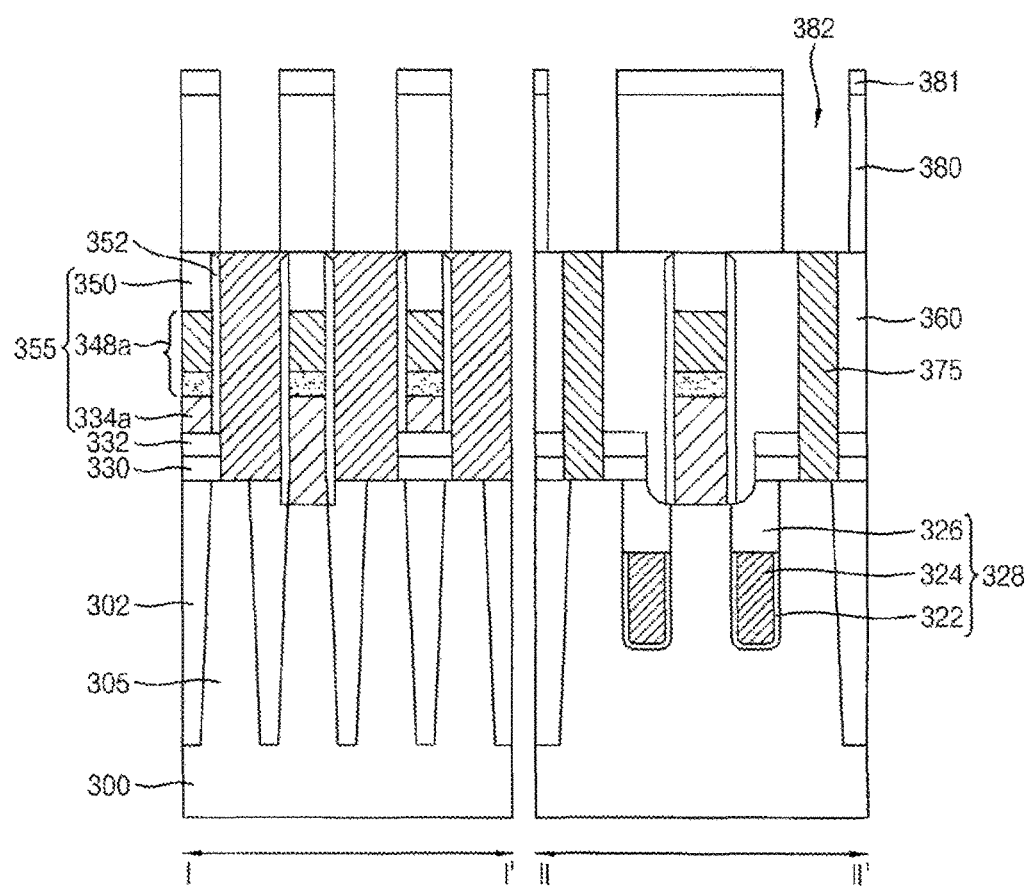

Referring to FIG. 33, an etch stop layer (not shown) and a mold layer may be formed on the second hard mask 350, the second insulating interlayer 360 and the contact plug 375. A third hard mask 381 may be formed on the mold layer. The third hard mask 381 may include holes 382, which may be corresponded to the contact plug 375.

In example embodiments, the third hard mask 381 may be formed by one of the processes for forming a first mask having holes, in accordance with example embodiments. In example embodiments, the first mask may be formed by processes substantially the same as or similar to those illustrated with reference to FIGS. 10 and 10B and 11A and 11B. Alternatively, the first mask may be formed by processes substantially the same as or similar to those illustrated with reference to FIGS. 12A and 12B to 16A and 16B.

The mold layer and the etch stop layer may be etched using the third hard mask 381 as an etching mask to form a mold pattern 380. The mold pattern 380 may include a capacitor opening exposing a top surface of the contact plug 375.

Figure 34:
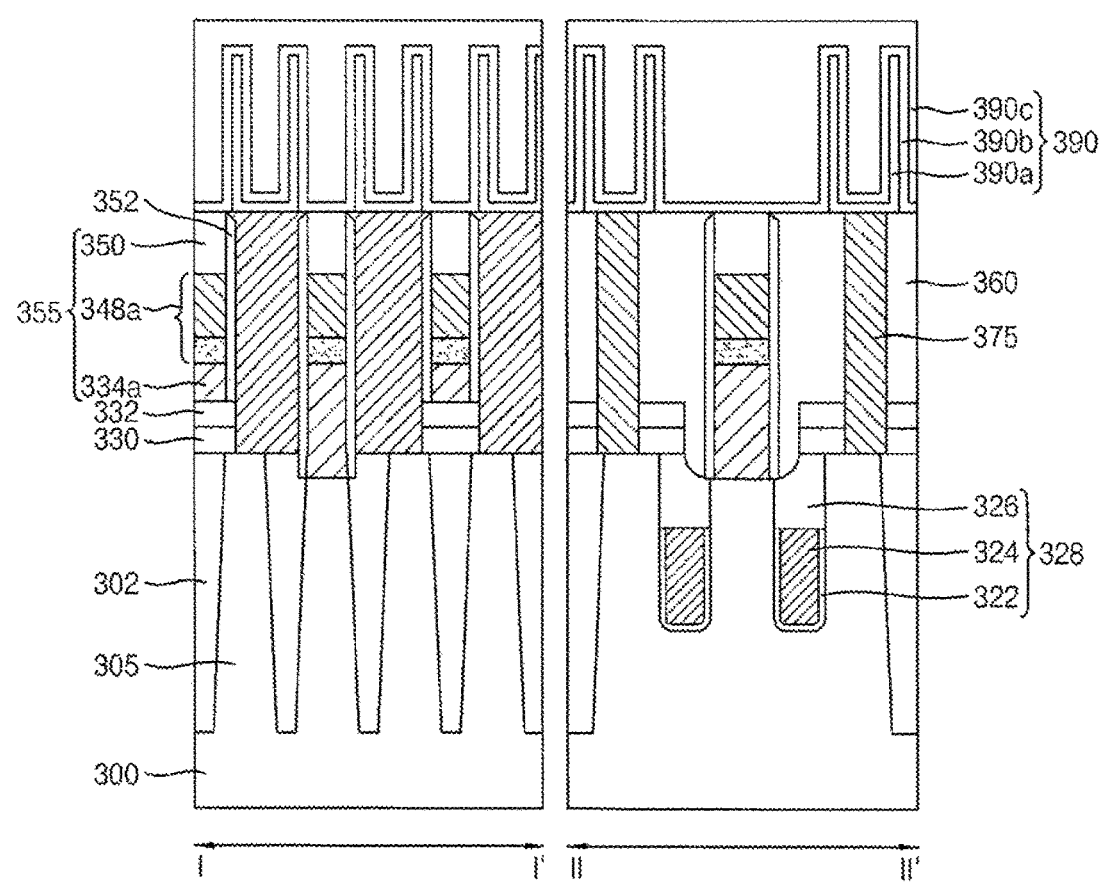

Referring to FIG. 34, a capacitor 390 may be formed on the contact plug 375. Thus, a DRAM device in accordance with example embodiments may be manufactured.

Particularly, the capacitor 390 may include a lower electrode 390a, a dielectric layer 390b and an upper electrode 390c sequentially stacked. The dielectric layer 390b may be formed of silicon oxide or a metal oxide. The lower and upper electrodes 390a and 390c may be formed of metal, e.g., tungsten, titanium, tantalum, ruthenium, etc, or a metal nitride, e.g., tungsten nitride, titanium nitride, tantalum nitride, etc.

As described above, a mask having a pillar shape or a mask including holes may be formed. Thus, the highly integrated semiconductor device may be manufactured using the mask.

In an embodiment of the present inventive concept, a three-dimensional (3D) memory array including the contact structure is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In example embodiments, the 3D memory array may include the contact structure in accordance with example embodiments.

The above semiconductor device may be applied to various types of systems, e.g., computing systems.

The foregoing is illustrative of example embodiments and is not to be construed as limiting thereof. Although example embodiments have been described, those skilled in the art will readily appreciate that many modifications are possible in the example embodiments without materially departing from the teachings of the example embodiments. Accordingly, all such modifications are intended to be included within the scope of the example embodiments as defined in the appended claims.

What is claimed is:

1. A method of manufacturing a semiconductor device, the method comprising:
    sequentially forming a mask layer and a first layer on a substrate;
    patterning the first layer by a photolithography process to form a first pattern, a second pattern, a third pattern and a fourth pattern, wherein the first, second, third and fourth patterns are each separated from each other and are each disposed at a vertex of an imaginary polygon in plan view;
    forming a silicon oxide layer on the first, second, third and fourth patterns, wherein the silicon oxide layer forms a first recess between the first, second, third and fourth patterns;
    spin coating a material including silicon on a sidewall of the first recess to form a coating pattern and a second recess, wherein, in plan view, a first thickness of the coating pattern at a corner of the first recess is greater than a second thickness of the coating pattern at a flat or curved portion of the first recess;
    forming a mask to fill the second recess;
    anisotropically etching the silicon oxide layer to form a mask structure, the mask structure including a silicon oxide pattern, the coating pattern and the mask stacked on one another; and
    etching the mask layer using a fifth pattern as an etching mask to form a mask pattern, the fifth pattern including the first, second, third and fourth patterns, and the mask structure.

2. The method of claim 1, wherein the fifth pattern is formed to have a pillar shape.

3. The method of claim 1, wherein forming the coating pattern includes:
    spin coating the material including silicon on the silicon oxide layer to form a coating layer; and
    baking the coating layer so that the material including silicon of the coating layer thermally reflows and the coating layer is bonded onto the silicon oxide layer to form the coating pattern.

4. The method of claim 1, wherein the coating pattern is formed of a material including silicon having a glass transition temperature (Tg) of about 100° C. to about 200° C.

5. The method of claim 1, wherein the silicon oxide layer includes an OH group at a surface thereof, and silicon of the coating layer is reacted with the OH group at the surface of the silicon oxide layer to form the coating pattern.

6. A method of manufacturing a semiconductor device, the method comprising:
    forming a first mask layer on a substrate;
    forming a plurality of second masks on the first mask layer, the plurality of second masks being disposed at vertices of continuously arranged polygons;
    conformally forming a silicon oxide layer on sidewails of the second masks and the substrate to form a first recess on the silicon oxide layer at a central portion of each of the polygons;
    spin coating a material including silicon on a sidewall of the first recess to form a coating pattern and a second recess having a round sidewall;
    forming a third mask to fill the second recess;
    anisotropieally etching the silicon oxide layer to form a third mask structure, the third mask structure including a silicon oxide pattern, the coating pattern and the third mask stacked on one another; and
    etching the first mask layer using the third mask structure and the second masks as an etching mask to form a mask pattern.

7. The method of claim 6, wherein forming the coating pattern includes:
    spin coating a material including silicon on the silicon oxide layer to form a coating layer; and
    baking the coating layer so that the material including silicon of the coating layer thermally reflows and the coating layer on the first recess of the silicon oxide layer is bonded onto the silicon oxide layer to form the coating pattern.

8. The method of claim 7, wherein the coating pattern is formed of a material including silicon having a glass transition temperature (Tg) of about 100° C. to about 200° C.

9. The method of claim 7, wherein the bake is performed at a temperature of about 150° C. to about 250° C., and the baking temperature is higher than a glass transition temperature (Tg) of the material including silicon.

10. The method of claim 7, further comprising removing a non-bonded portion of the coating layer by a developing process after forming the coating pattern.

11. The method of claim 6, wherein the silicon oxide layer includes an OH group at a surface thereof, and the silicon of the spin coated material is reacted with the OH group at the surface of the silicon oxide layer to form the coating pattern.

12. The method of claim 6, wherein each of the second masks has a circular shape having a first diameter, in a plan view.

13. The method of claim 12, wherein the silicon oxide layer is formed such that a minimum width of the first recess is about 1 time to about 1.1 times a size of the a diameter of each of the second masks.

14. The method of claim 6, wherein forming one of the plurality of second masks includes:
forming a second mask layer on the first mask layer; and
patterning the second mask layer by a photolithography process.

15. The method of claim 6, wherein forming one of the plurality of second masks includes:
forming a sacrificial layer on the first mask layer;
patterning the sacrificial layer by a photolithography process to form a preliminary sacrificial pattern including holes;
forming a second mask to fill the holes; and
removing the preliminary sacrificial pattern.

16. The method of claim 6, wherein the second mask and the third mask include substantially the same material.

17. The method of claim 6, further comprising, after forming the first mask:
forming a filling layer on the substrate to fill a gap between first masks; and
removing the first masks to form a filling layer having a hole.

18. A method of manufacturing a semiconductor device, the method comprising:
forming a first mask layer on a substrate;
forming a plurality of second masks on the first mask layer, the plurality of second masks being disposed at vertices of continuously arranged polygons;
conformally forming a silicon oxide layer on sidewalls of the second masks and the substrate to form a first recess on the silicon oxide layer at a central portion of each of the polygons;
spin coating a material including silicon on a sidewall of the first recess to form a coating pattern and a second recess having a round sidewall;
forming a third mask to fill the second recess;
etching the silicon oxide layer on the plurality of second masks to form a third mask pattern, the third mask pattern including a silicon oxide pattern, the coating pattern, and the third mask, stacked on one another; and
etching the first mask layer using the third mask pattern and the second masks to form a mask pattern.

19. The method of claim 18, wherein forming the coating pattern includes:
spin coating a material including silicon on the silicon oxide layer to form a coating layer; and
baking the coating layer so that the material including silicon of the coating layer thermally reflows and the coating layer on the first recess of the silicon oxide layer is bonded onto the silicon oxide layer to form the coating pattern.

20. The method of claim 19, wherein the coating pattern is formed of a material including silicon having a glass transition temperature (Tg) of about 100° C. to about 200° C.

* * * * *